(12) United States Patent
Leibowitz et al.

(10) Patent No.: US 9,046,909 B2
(45) Date of Patent: Jun. 2, 2015

(54) ON-CHIP REGULATOR WITH VARIABLE LOAD COMPENSATION

(75) Inventors: Brian S. Leibowitz, San Francisco, CA (US); Michael D. Bucher, Carrboro, NC (US); Lei Luo, Durham, NC (US); Chaofeng Charlie Huang, San Jose, CA (US); Amir Amirkhany, Sunnyvale, CA (US); Huy M. Nguyen, San Jose, CA (US); Hsuan-Jung (Bruce) Su, Chapel Hill, NC (US); John Wilson, Raleigh, NC (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 14/241,843

(22) PCT Filed: Aug. 31, 2012

(86) PCT No.: PCT/US2012/053504
§ 371 (c)(1),
(2), (4) Date: Feb. 27, 2014

(87) PCT Pub. No.: WO2013/033622
PCT Pub. Date: Mar. 7, 2013

(65) Prior Publication Data
US 2014/0210545 A1      Jul. 31, 2014

Related U.S. Application Data

(60) Provisional application No. 61/530,775, filed on Sep. 2, 2011, provisional application No. 61/601,977, filed on Feb. 22, 2012.

(51) Int. Cl.
G05F 1/10       (2006.01)
G05F 1/46       (2006.01)
G11C 5/14       (2006.01)

(52) U.S. Cl.
CPC ................ G05F 1/462 (2013.01); G11C 5/147 (2013.01)

(58) Field of Classification Search
CPC ................................ G11C 5/147; G05F 1/462
USPC ......... 327/538, 530, 540, 541, 543, 544, 545, 327/546, 108, 109, 111, 112
See application file for complete search history.

(56) References Cited

U.S. PATENT DOCUMENTS

| | | | | |
|---|---|---|---|---|
| 5,726,946 A | * | 3/1998 | Yamagata et al. | 365/226 |
| 6,218,823 B1 | | 4/2001 | Keeth | |
| 6,326,837 B1 | * | 12/2001 | Matano | 327/545 |
| 6,801,061 B2 | * | 10/2004 | Cowles | 327/108 |
| 6,897,715 B2 | | 5/2005 | Barber, Jr. et al. | |
| 7,180,276 B2 | | 2/2007 | Telecco | |

(Continued)

OTHER PUBLICATIONS

International Search Report and Written Opinion dated Jan. 3, 2013 in International Application No. PCT/US2012/053504. 11 pages.

(Continued)

*Primary Examiner* — Jung Kim
(74) *Attorney, Agent, or Firm* — Lance Kreisman; Peninsula Patent Group

(57) ABSTRACT

An integrated circuit includes a voltage regulator to supply a regulated voltage and a data output that couples to an unterminated transmission line. The circuit draws a variable amount of power from the voltage regulator according to the data. The voltage regulator includes a first current generation circuit to provide a data transition-dependent current.

15 Claims, 19 Drawing Sheets

(56) References Cited

U.S. PATENT DOCUMENTS

| | | |
|---|---|---|
| 7,345,463 B2 | 3/2008 | Isham |
| 7,759,916 B2 | 7/2010 | Kleveland |
| 7,880,531 B2 * | 2/2011 | Park .............................. 327/538 |
| 8,860,469 B1 * | 10/2014 | Ding et al. ..................... 327/108 |
| 2004/0008077 A1 | 1/2004 | Ho et al. |
| 2008/0203983 A1 | 8/2008 | Lo Lacono et al. |
| 2010/0026251 A1 | 2/2010 | Lam et al. |

OTHER PUBLICATIONS

Palmer et al., "A 4.3GB/s Mobile Memory Interface With Power-Efficient Bandwidth Scaling," 2009 Symposium on VLSI Circuits Digest of Technical Papers. 2 pages.

* cited by examiner

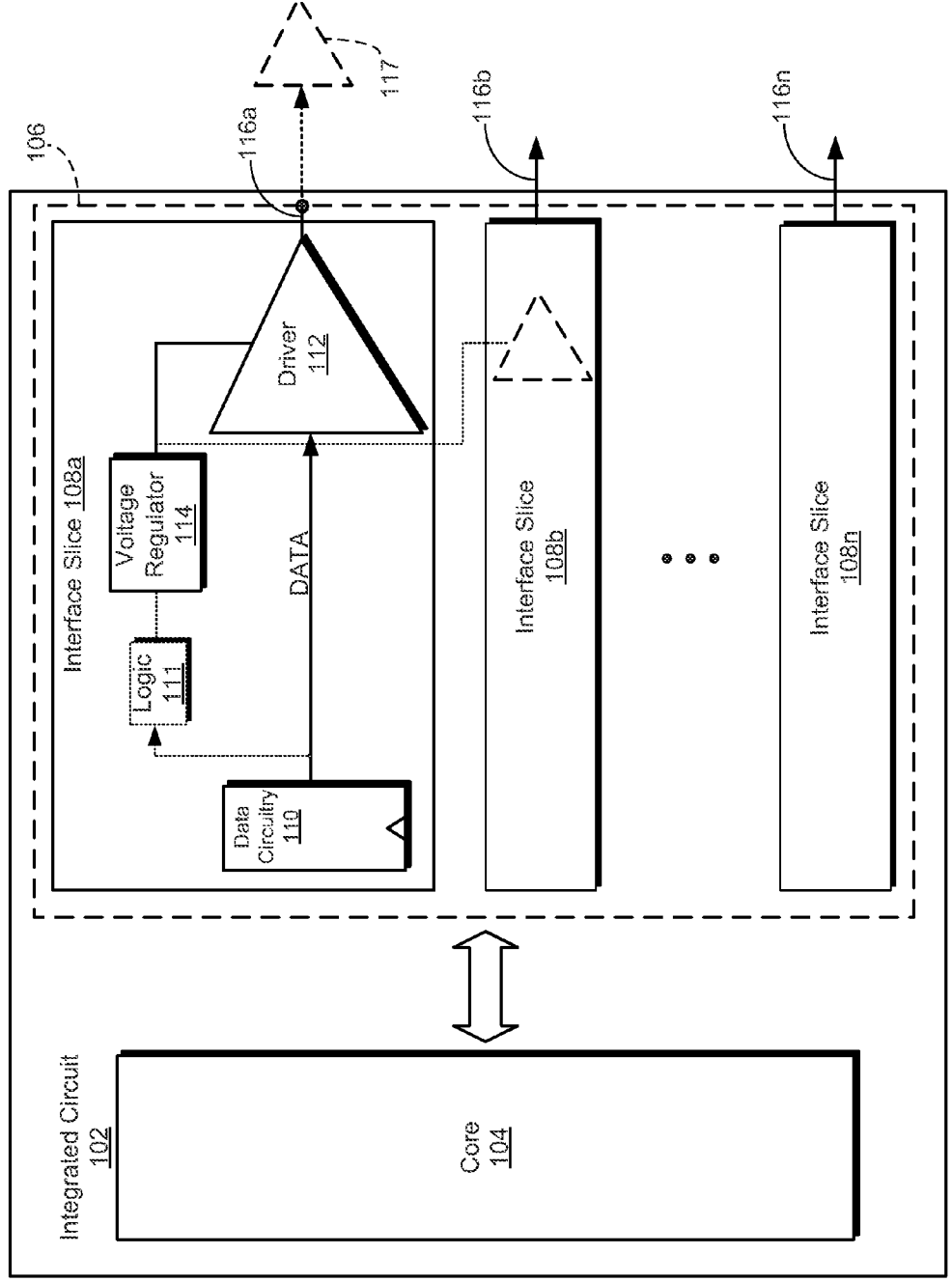

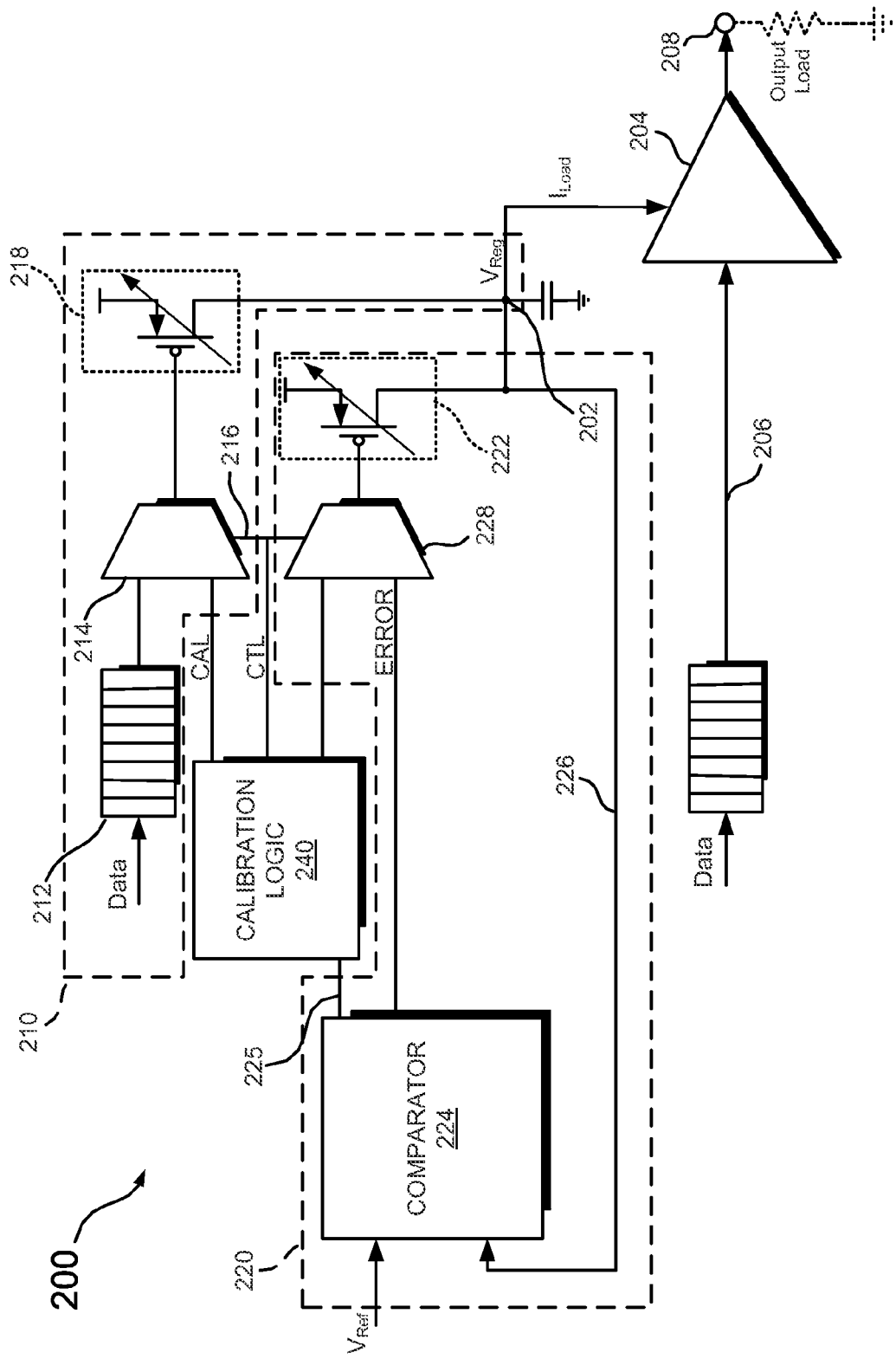

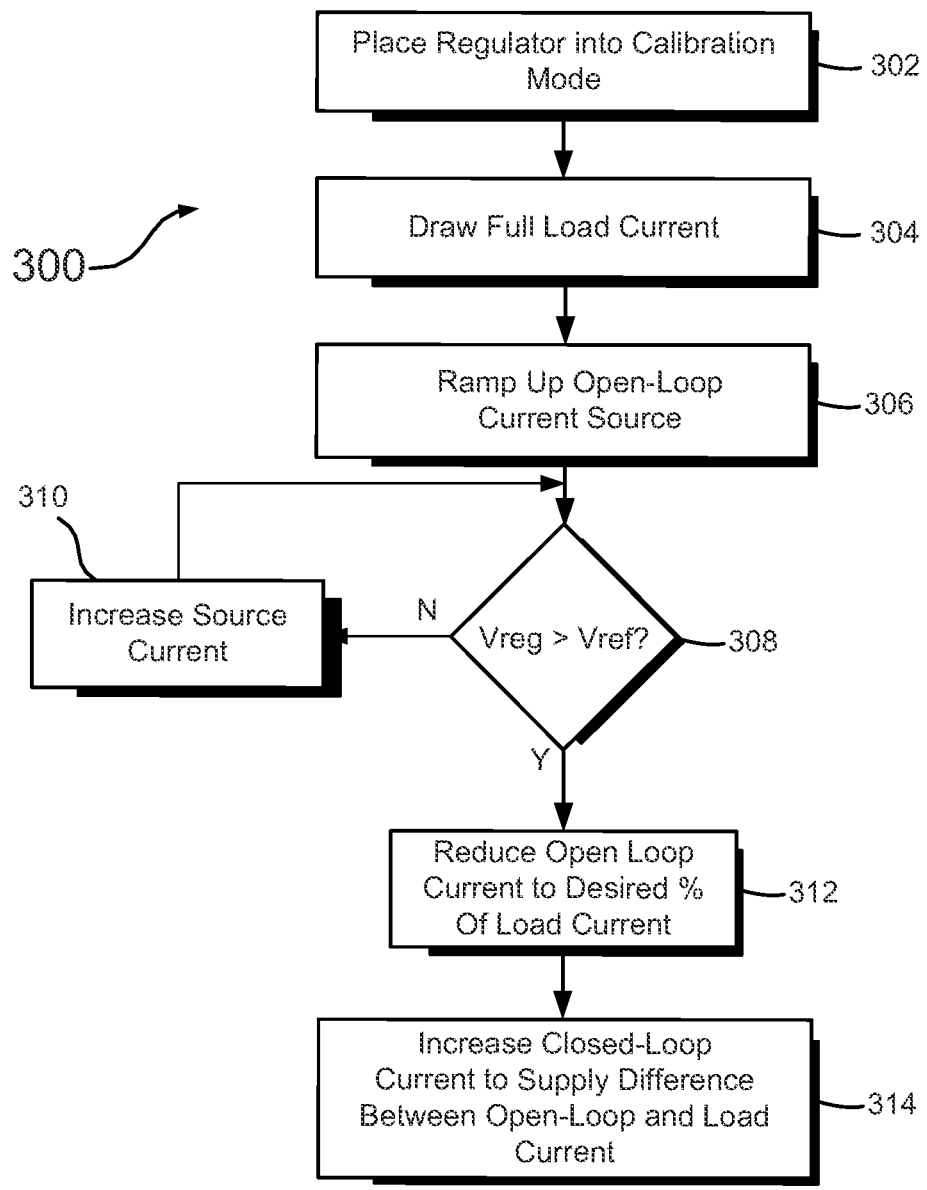

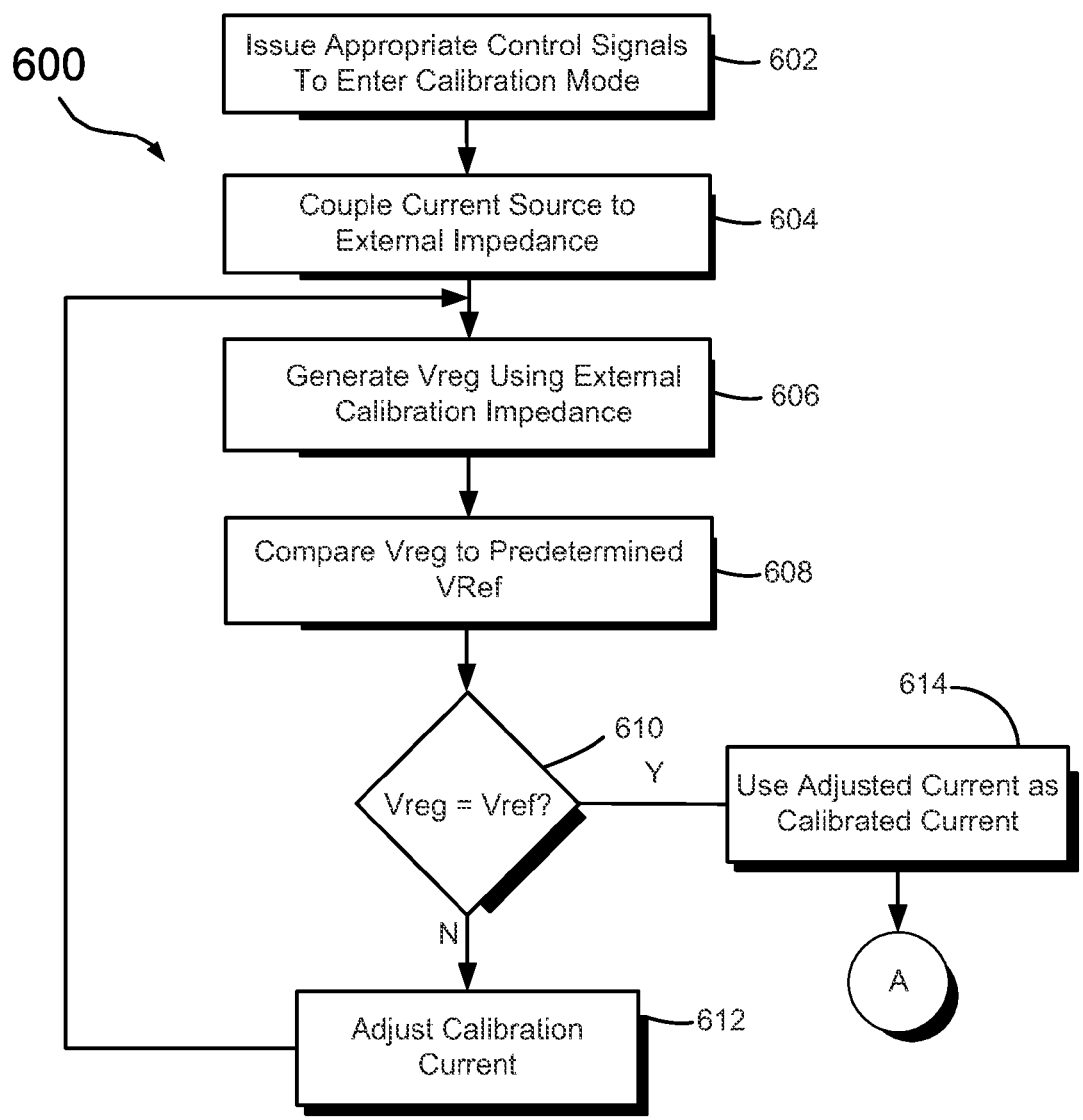

ON-CHIP REGULATOR WITH VARIABLE LOAD COMPENSATION

CROSS-REFERENCE TO RELATED APPLICATIONS/TECHNICAL FIELD

Pursuant to 35 U.S.C. §365, this application claims priority from International Application No. PCT/US2012/053504 published as WO 2013/033622 A1 on Mar. 7, 2013, which claims priority from U.S. Provisional Application No. 61/530,775, filed Sep. 2, 2011 and entitled "ON-CHIP REGULATOR WITH VARIABLE LOAD COMPENSATION" and U.S. Provisional Application No. 61/601,977, filed Feb. 22, 2012 and entitled "ON-CHIP REGULATOR WITH VARIABLE LOAD COMPENSATION". International Application No. PCT/US2012/053504 and U.S. Provisional Application Nos. 61/530,775 and 61/601,977 are hereby incorporated by reference in their entirety.

The disclosure herein relates to voltage regulation, and more specifically to on-chip integrated circuit voltage regulators.

BACKGROUND

For I/O driver circuits that drive signals having predefined signal levels along an external signaling path, an accurate and fast power-cycling voltage regulator is important for a variety of reasons, including the need to maintain high efficiency by powering down during idle periods between bursts of communication. One of the difficulties encountered by conventional output driver voltage regulators lies in the changing load current that varies with the transmission of data.

Thus, the need exists for improved voltage regulators that quickly provide a regulated voltage that is maintained even under varying load conditions.

BRIEF DESCRIPTION OF THE DRAWINGS

Embodiments of the disclosure are illustrated by way of example, and not by way of limitation, in the figures of the accompanying drawings and in which like reference numerals refer to similar elements and in which:

FIG. 1 illustrates a high-level transmitter circuit including a voltage regulator circuit according to an embodiment;

FIG. 2A illustrates one embodiment of a voltage regulator for use in the transmitter circuit of FIG. 1;

FIG. 3 illustrates a flowchart describing a sequence of steps outlining the operation of the voltage regulator of FIG. 2;

FIG. 6A illustrates a portion of a flowchart representing a sequence of steps outlining the operation of the voltage regulator of FIG. 4;

DETAILED DESCRIPTION

Figure 2B:
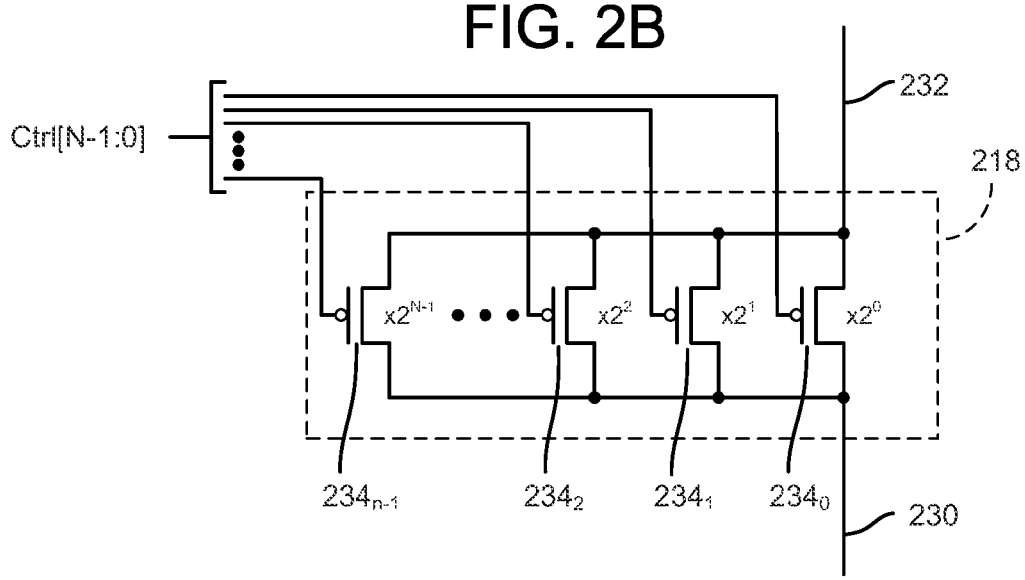
FIG. 2B illustrates one embodiment of a segmented current driver for use in the regulator of FIG. 2A.

Embodiments of integrated circuits are disclosed herein. One embodiment of the circuit includes a voltage regulator to supply a regulated voltage. A processing circuit processes data and uses a variable amount of power from the voltage regulator that varies according to the data. The voltage regulator includes an open-loop current source coupled to the circuit, the open-loop current source responds to a calibration setting to provide a calibrated open-loop current. The voltage regulator also includes a closed-loop current source disposed in a feedback path and has an output coupled to the circuit. Input sensing circuitry in the feedback path detects the regulated voltage and controls the closed-loop current source in producing a closed-loop current to the circuit based on a difference between the actual load current and the current drawn by the circuit.

In a further embodiment, a method of providing a regulated voltage to a voltage node coupled to a variable load is disclosed. The method comprises, in a calibration mode, setting a calibrated current for supplying to the variable node based on one or more known load parameters; and in an operating mode, predicting an increase in load current on the node; supplying the calibrated current into the node based on the predicting; and providing supplemental current to the node based on a difference between the calibrated current and an actual load current.

In yet another embodiment, a voltage regulator to supply a regulated voltage is disclosed. A circuit processes data and has an output for coupling to an unterminated transmission line. The circuit uses a variable amount of power from the voltage regulator that varies according to the data. The voltage regulator includes a current generation circuit that responds to a calibration setting to provide a calibrated open-loop current.

A further embodiment discloses a method of providing a regulated voltage to a voltage node coupled to a variable load. The method comprises, in a calibration mode, setting a calibrated current for supplying to the variable node based on one or more known load parameters; and in an operating mode, predicting an increase in load current on the node; supplying the calibrated current into the node based on the predicting; and providing supplemental current to the node based on a difference between the calibrated current and an actual load current.

FIG. 1 illustrates a high-level block diagram according to one embodiment of an integrated circuit or chip 102. The integrated circuit generally includes core circuitry 104 that generates and distributes data to an interface 106. For embodiments where the integrated circuit is a processor or memory controller, the core circuitry 104 generally includes high-speed logic circuitry. Where the integrated circuit is used as a memory device, such as a dynamic random access memory (DRAM), the core is generally made up of memory storage cells. The interface 106 provides a physical interface for communicating with one or more other ICs and employs a plurality of interface slices 108a-108n for transmitting data in parallel along corresponding external signaling paths 116a-116n to the one or more other ICs (not shown). For purposes of brevity, receiver circuitry is not shown in FIG. 1, but may readily be incorporated into the physical interface to form a transceiver arrangement within each interface slice.

In some embodiments, each interface slice, such as that labeled 108a, includes data circuitry 110 that buffers and feeds signals representing data bits or sequences to a data transmitter or driver 112 along data path DATA. In some embodiments described herein, copies of the data bits or sequences are directed to an input of a voltage regulator 114 that regulates one or more voltages used by the driver 112 to generate output waveforms. By receiving a copy of the data just prior to data transmission, the voltage regulator 114 may quickly pre-compensate for output loading associated with the known transmission event with a compensation signal (such as an increase in current) as more fully described below. In this manner, delays in generating high-accuracy signal levels may be minimized. Other embodiments described herein predict for output loading in ways other than predictive data transmissions.

In another exemplary application, the embodiment of FIG. 1 can be applied to voltage-mode differential systems with transmit equalization. The current through the voltage regulator in such systems is perturbed by the data stream driven into the driver. The data-stream feeding the driver, can therefore, be logically processed with logic circuitry 111 to control the open-loop current injected into the driver to compensate for current variations. In yet a further application, the voltage regulator may be employed in one or more of the interface slices, such as 108a, and shared with one or more of the other interface slices, such as 108b. This is in contrast to the per-lane embodiment introduced above.

FIG. 2A illustrates further detail regarding one embodiment of a voltage regulator 200 suitable for use with the integrated circuit 102 of FIG. 1. The regulator provides a regulated voltage $V_{REG}$ at a voltage regulator output node 202 for use as a power supply for a driver 204 that transmits data sequences provided by an on-chip data path 206 to an output pin 208. To provide a fast-cycling and highly accurate regulated voltage, the regulator 200 includes an open-loop path 210 having an input data buffer 212 to receive data signals corresponding to a data sequence being queued for data transmissions by the data driver 204. The data buffer feeds one input of a selector 214, such as a multiplexer that selectively passes the data signal(s) or a calibration pattern CAL, depending upon a mode signal CTL applied to a control input 216 on the selector. The selector includes an output that drives a variable open loop current source 218. In one embodiment, the current source is a programmable current source 218 that, in one specific embodiment, takes the form of a segmented P-type MOS transistor device. As more fully described below with respect to FIG. 2B, one embodiment of the segmented current source employs a plurality of selectable "fingers" that are individually controlled in accordance with respective values of a memory or register.

With the open-loop path 210 responsive to the data sequence, it provides a fast mechanism for delivering source current into the voltage regulator output node 202 from the feed-forward data transmission sequences. The quick response of the open-loop path is generally due to fewer circuit components and shorter circuit path lengths associated with the open-loop path as compared to the closed-loop path. This also results in a highly accurate supplemental current supplied to the voltage regulator output node 202 via a closed-loop current path 220. The closed-loop path includes a variable closed-loop current source that in one embodiment comprises a second segmented P-MOS current driver 222 similar to the open-loop current source 218. The closed-loop current source is responsive to an error signal ERROR generated by a comparator 224 that compares the regulation node voltage $V_{REG}$, sensed along a feedback path 226, to a reference voltage $V_{REF}$. The comparator output is then fed as the error signal ERROR to a second selector 228 which, in a normal operation mode, provides the comparator output as a gate drive signal for the current source 222. Depending on the application, the feedback comparison may be handled continuously, such as by an analog op-amp based circuit embodiment, or discretely, such as by a digital sampler-based comparison scheme. By receiving a copy of the data sequence just prior to data transmission, and exhibiting a shorter circuit path with fewer circuit components, the open-loop path may quickly pre-compensate for output loading associated with known data transmission events. This supplemental current is in addition to the current provided by the relatively slower, but more accurate closed-loop path. The combined operation of the two paths provides both quick responsiveness, when needed, along with long-term high accuracy regulation.

To provide maximum flexibility and programmability in setting the current levels for the open and closed-loop current sources, the regulator 200 employs calibration logic 240 that receives output signals from the comparator 224 along path 225 and provides calibration control signals to the inputs of selectors 214 and 228 in a calibration mode. The calibration logic includes pattern generation circuitry (not shown) that generates predetermined or other bit patterns for feeding to the open and closed-loop current sources during the calibration routine. In some embodiments, live patterns may be employed without using a bit pattern already known to the receiver.

FIG. 2B illustrates an embodiment of a programmable current source suitable for use as the open and/or closed-loop current sources 218 and 222. As shown, a set of N binary-weighted transistors $x2^0 - x2^{N-1}$ (i.e., transistors that have transconductance values that are binary multiples of one another, ranging from a reference transconductance, $2^0$ to a transconductance $2^{N-1}$) are coupled in parallel as "fingers", between an input path 230 and an output path 232. The current source shown is formed by MOS transistors $234_0 - 234_{n-1}$, with the gate terminals of the transistors coupled to receive respective bits of a control value Ctrl[N−1:0], with voltages consistent with biasing the transistors in the saturation region to behave as current sources. The use of different weights provides one design option for achieving a range of possible current drive values, but other alternatives notably exist, including equally weighted transistors, and other forms of non-binary-multiple weights that may be affected, for example, through use of different length-to-width ratios. The size of the MOS transistors can be optimized to achieve specific drive current range for a particular application.

Figure 2C:
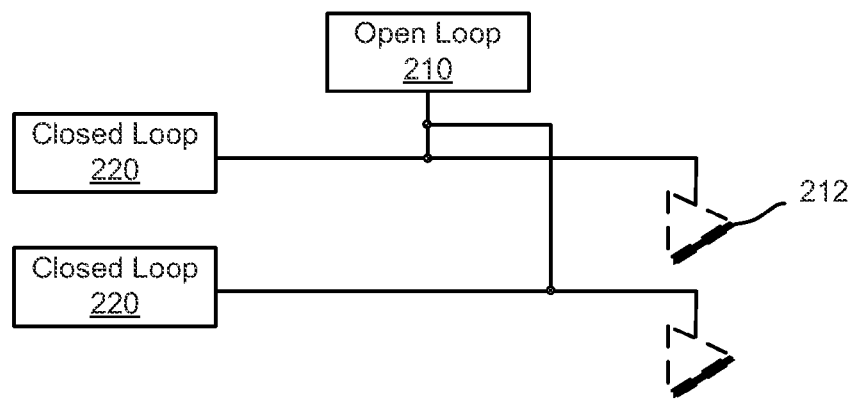
FIGS. 2C and 2D illustrate block diagrams of embodiments exhibiting regulators similar to the voltage regulator circuit of FIG. 2A shared with multiple lanes.
Figure 2D:
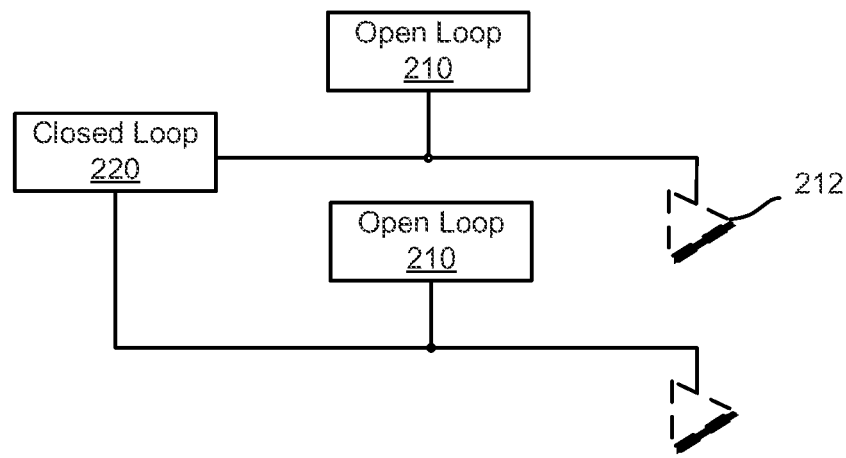

FIGS. 2C and 2D illustrate block diagrams of various regulator embodiments that share at least a portion of the regulator circuitry with multiple lanes. For example, in FIG. 2C, a single open-loop path 210 is shared with multiple drivers 212 (corresponding to driver 112 of FIG. 1), while a pair of closed-loop paths 220 exhibits a per-lane configuration with the drivers. FIG. 2D illustrates a similar approach, with a shared closed-loop path 220 and per-lane open loop paths 210.

FIG. 3 illustrates a high-level flowchart of one embodiment of a calibration method, generally designated 300, employed by the regulator of FIG. 2A to set the open and closed-loop current sources. The process begins by placing the regulator circuit into a calibration mode, at step 302. The calibration mode may be initiated and performed once by a startup initialization routine, or by triggering a threshold condition resulting in one or more periodic calibration procedures during operation. Upon entering the calibration mode, the closed-loop current source is deactivated, and the input data path to the open-loop path is switched to receive the calibration pattern data. A copy of the calibration pattern data is also fed to the driver as a calibration data input. The driver then transmits the data to the output pin (which is coupled to an external transmission line coupled to a second integrated circuit), thus quickly creating a full load current condition on the voltage regulator output node, at step 304. This full load condition, if left unchecked, creates a droop condition on the regulation node whereby the regulated voltage drops below an acceptable value. To prevent this condition, as the driver transmits the calibration data, the copy of the data fed to the open-loop current source activates the source to deliver current at a first level to the voltage regulator output node, at step 306. With the closed-loop comparator active, the regulation voltage $V_{REG}$ is then compared to a reference voltage $V_{REF}$. The reference voltage is set to a level where for most, if not all cases, the regulation voltage will be less than the reference voltage during the first iterations of the calibration routine under a full load current. A determination is then made, at step 308, whether $V_{REG} > V_{REF}$. If $V_{REG}$ is less than $V_{REF}$, an indication is sent to the calibration logic via path to increase the open-loop source current, at 310 (adjusting the number of fingers participating in current generation within the segmented source). The comparison/adjustment steps iterate until the regulation voltage $V_{REG}$ converges to the reference voltage $V_{REF}$ (or until some other threshold level is reached). At this point, the open-loop current is reduced by a predetermined percentage of the full load current, at step 312. The closed-loop current source path is then fully activated to converge on a solution that provides accurate supplemental current until $V_{REG} = V_{REF}$, at step 314. Once the open and closed-loop current paths are calibrated for the appropriate current levels, the regulator may be placed in a normal operation mode.

During normal operation, the driver may undergo periods of activity and inactivity in terms of data transmissions. For example, during an interval where no data is transmitted, the driver correspondingly draws little to no output load current. In contrast, swinging from a "no current" condition to a "full current" condition places a demand on the voltage regulator output node for current sufficient to drive the load. By feeding copies of data sequences in parallel to both the open-loop current source (i.e., to add an offset current as appropriate) and the driver, the open-loop path can predictably supply additional load current sufficient to supply the driver during a full load current condition. Since the open-loop current source receives data directly and ties into the regulation node, the feed-forward nature of the path enables fast injection of the source current into the node. This method helps reduce the data-dependent noise on the regulated node and enhances driver performance, especially for low-power single-ended drivers.

With the open-loop current source providing a fast current supply source to satisfy the output load current demand, fine control of the regulation voltage $V_{REG}$ is managed over a longer time interval through the closed-loop path. The closed-loop path monitors the regulation node, compares the value to the reference voltage value, and incrementally increases or decreases the supplemental current. Current adjustments are made through activation/deactivation of selectable fingers in the second segmented current source.

As noted above, the voltage regulator embodiment described above lends itself well to single-ended signaling architectures since those architectures are often susceptible to relatively large output load current fluctuations. Integrated circuit devices such as mobile DRAM and associated controller chips provide one example of such architectures. By predicting data transmissions and providing additional load current to compensate for those transmissions as they occur in the driver, output load variations may be minimized to correspondingly improve performance and reduce power dissipation. While differential architectures are less susceptible to output current variations along a differential signaling path, the regulator described above may be advantageous in many differential driver contexts.

Figure 4:
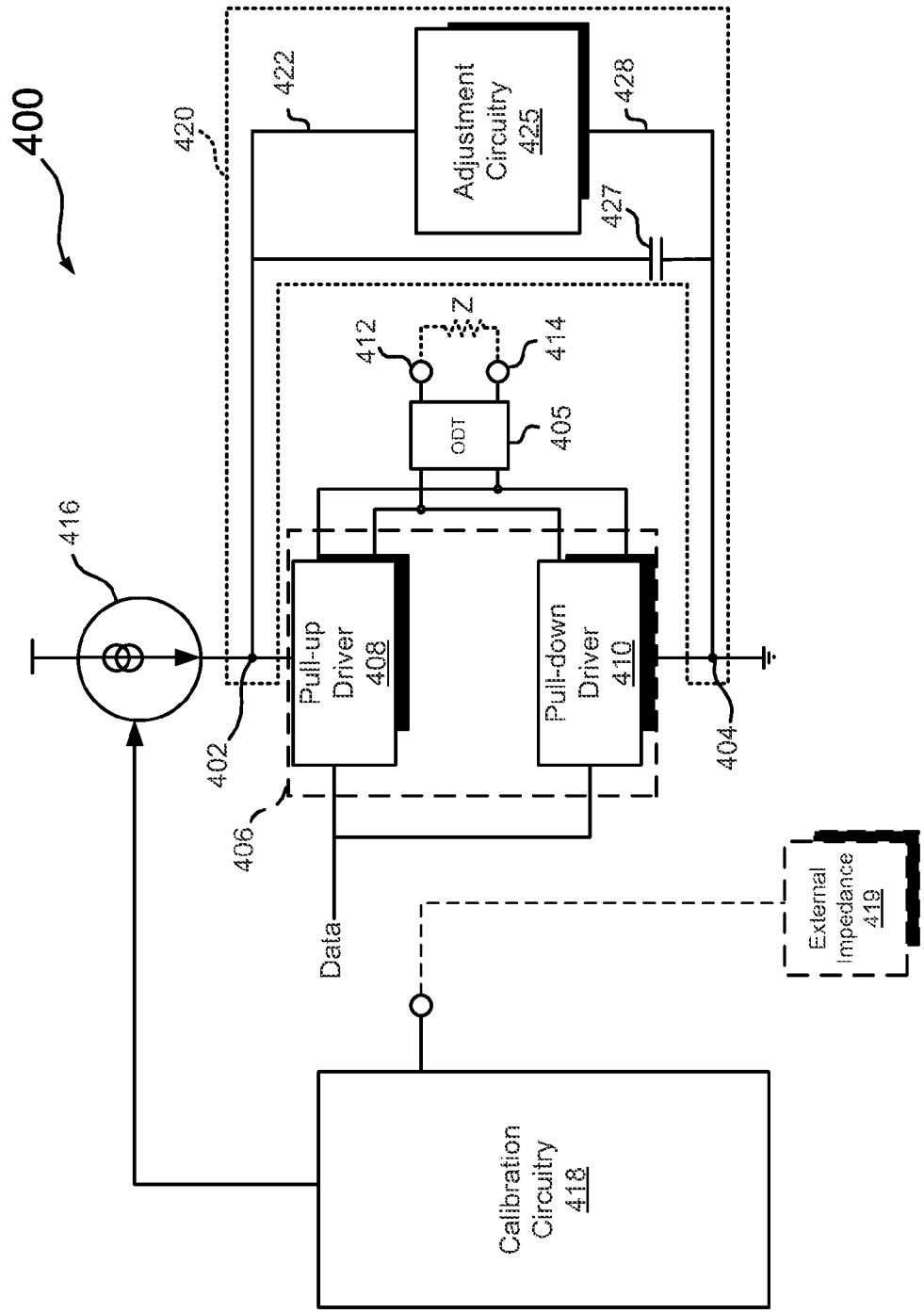
FIG. 4 illustrates a further embodiment of a voltage regulator for use with the transmitter circuit of FIG. 1.

FIG. 4 illustrates a further embodiment of a voltage regulator circuit, generally designated 400, having a regulated node 402 with respect to a ground node for use by a differential driver 406. The differential driver includes respective pull-up and pull-down driver circuits 408 and 410 that sink or source current along a differential link (not shown, but configured to connect to driver output pins 412 and 414) in accordance with a predefined signaling protocol.

In one embodiment, the differential driver 406 forms a portion of a transceiver that both transmits and receives data. As such, the driver couples to an on-die termination circuit (ODT) 405 that forms a receive-side termination resistance for the link. The described ODT circuit (not shown) is formed at the other end of the link opposite to the driver circuit 406 on a different integrated circuit chip (not shown). Thus, when the driver 406 is in a transmit mode, the ODT circuit at the other end of the link is enabled as a termination impedance. When the driver circuit 406 is in a receive mode (as a receiver), the ODT 405 is enabled as a termination impedance for the other end of the link.

Further referring to FIG. 4, the voltage regulator 400 includes an open-loop path including current source circuitry 416 coupled to the regulation nodes 402 and 404. The current source circuitry may take the form of respective variable current sources. The current sources may be programmable. In one embodiment, the current sources comprise complementary segmented current drivers, each including fingers responsive to a register similar to that described for the open-loop current source of FIG. 2. Calibration circuitry 418 couples to the open-loop current source circuitry to properly set the open-loop current level. This may be done, for example, during an initialization routine, or periodically upon certain parameter thresholds being reached.

To supplement the current provided by the open-loop path formed by the current source circuitry 416, a closed-loop current path 420 similar to that shown in FIG. 2 is provided by the voltage regulator 400, although in a differential transmitter context. The closed-loop path 420 includes paths 422 and 428 coupled to each regulation node 402 and 404, respectively. Adjustment circuitry 425 compares the sensed voltages to a reference voltage, determines the error, and provides supplemental current to the appropriate node along the paths 422 and 428. Adjustment circuitry 425 may therefore sink current from node 402 if current source 416 provides more current than is drawn by driver 406. In other embodiments adjustment circuitry 425 may be able to source or sink current into node 402. Bypass capacitance is provided by capacitor 427 to provide a predetermined level of stability and accuracy to the closed-loop current. The supplemental current generated by the closed-loop path 420 thus amounts to the difference between what the open-loop current source circuitry 416 delivers to the regulation nodes 402 and 404, and the actual current drawn from the nodes as a result of the driver output loading.

With continued reference to FIG. 4, the regulator circuit 400 employs calibration circuitry 418 for calibrating a variety of parameters, including the initial open-loop and closed-loop current values for optimum voltage regulation at the regulation nodes 402 and 404. As explained in further detail below, the calibration circuitry selectively couples to an external impedance 419 having a known value. In this manner, the current levels may be tied to known impedance levels, and used during operation to quickly provide sufficient load current when needed.

Figure 5:
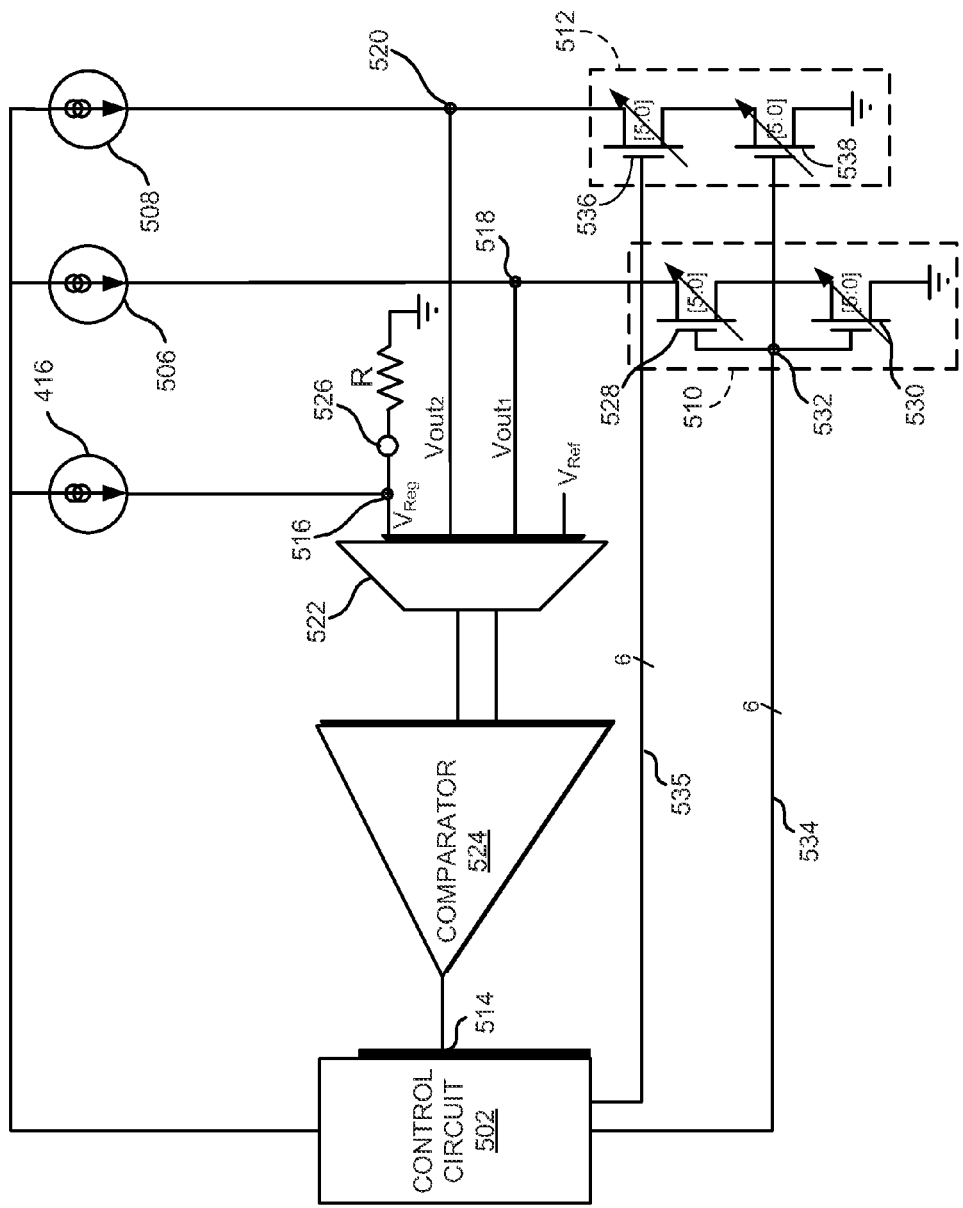
FIG. 5 illustrates one embodiment of calibration logic employed in the voltage regulator of FIG. 4.

FIG. 5 illustrates one embodiment of the calibration circuitry 418 in further detail. The circuitry includes control block 502 that provides a programmable interface for interacting with the open-loop segmented current driver circuitry. The interface also controls additional current drivers 506 and 508 that supply calibrated current to respective "pull-down" and "push-up" replica driver circuits 510 and 512. A monitor input 514 feeds circuit voltages associated with the voltage regulator to the control block 502 during a calibration mode. The voltages are sensed from a variety of monitoring nodes associated with the regulation voltage, at 516, and respective nodes 518 and 520 associated with the replica drivers 510 and 512. A selector in the form of a multiplexer 522 receives and selectively passes one or more of the voltages to a comparator 524 for comparison to a reference, such as a reference voltage $V_{REF}$. Although voltages are sensed in the above implementation, currents may also be selected, compared and passed to the control circuit 502.

With continued reference to FIG. 5, the calibration circuitry includes an output pin 526 for coupling to an external reference load R that approximates the output loading seen by the differential driver. The external reference load connects to the calibration pin 526, drawing current from the open loop current source and generating a voltage $V_{REG}$ at node 516. During calibration, the multiplexer 522 selectively passes the voltage $V_{REG}$ generated at the regulation node 516 to the comparator. Further details regarding the steps carried out during calibration are described below.

Further referring to FIG. 5, in addition to interfacing with the open-loop current source, the calibration circuitry employs the current sources 506 and 508 to cooperate with the replica drivers 510 and 512. The replica drivers conveniently provide respective reference copies of the external impedance circuitry R, and the operational push-pull differential driver 406 (FIG. 4). These reference copies are useful during calibration to provide a more accurate estimation of the total load acting on the driver 406 (FIG. 4) during operation. Each replica driver is formed as a stack of NMOS transistor impedance blocks referred to as an N-over-N configuration. The pull-down replica driver 510 employs a pair of series-connected NMOS transistors 528 and 530 having a common gate connection at 532. The pull-down replica driver 510 is configured so that both transistors 528 and 530 are activated during calibration to draw current from the source 506 to generate a voltage $Vout_1$ at node 518. The voltage is compared to the regulator voltage 516 with the external impedance R connected to pad 526. The input connection to the driver 510 receives a multi-bit control input along path 534 for activating/deactivating impedance blocks within the load replica driver to correspondingly adjust the current through the driver and thus the voltage at node 518. The multi-bit code used to adjust the pull-down driver 510 is then used for the push-pull driver 512. The push-pull replica driver 512 includes a pull-up driver element 536 that receives input adjustment codes from path 535, and a pull-down driver element 538 which receives the input code fed to the pull-down driver 510. Driver elements 536 and 538 allow for a push-pull driver configuration that emulates the operational driver. Like the pull-down replica driver 510, the impedance of the push-pull replica driver transistors 536 and 538 may be adjusted via codes generated by the control circuit 502 and presented by the multi-bit input 535 as necessary during calibration. Adjustments to the impedance values are handled during the calibration operations are more fully described below.

With renewed reference to FIG. 4, prior to running in an operation mode, the regulator circuit 400 undergoes a sequence of calibration steps in a calibration mode to accurately set various parameters. The calibration mode may be initiated as part of an initialization routine for the integrated circuit, or carried out periodically to adjust for expected process-voltage-temperature variations. At a high level, the calibration involves setting a proper open-loop current based on an external reference load and the equalizer coefficient, and utilizing the calibrated current to calibrate the impedance of the replica drivers, which are then used as references for calibrating the ODT circuit 405. By calibrating these various parameters, the voltage regulator circuitry 400 can take advantage of known loading to more symmetrically operate in a normal mode of operation.

Alternatively, calibration may be performed by first calibrating the driver pull-up and pull-down impedances. This may be done, for example, by using a replica of the driver, an external resistor and a reference voltage. The replica is then set to an equalizing mode and a reference current created that is proportional to the difference between the equalizing current and the unequalizing current. In a further embodiment, the current can be roughly calculated and generated as a function of the driver calibrated impedance and equalizer coefficients. Any mismatches arising from driver calibration error or coefficient inaccuracy can be left to the closed-loop compensation to cancel.

FIG. 6A illustrates a flowchart setting forth a sequence of steps, generally designated 600, for calibrating the open-loop current source circuitry 416. To enter the calibration mode of operation, the control circuit issues appropriate control signals for configuring the selector to pass a predetermined voltage reference $V_{REF}$ and a sensed voltage on the regulation node to the comparator, at step 602. A consideration in calibrating the current source involves accurately predicting the output loading during normal operation. The external reference resistor R (e.g., in the case of the embodiment of FIG. 5) provides this predicted output loading through activation of the I/O pad that selectively couples the resistor to the current source, at step 604. A pre-set multi-bit current value is then sent by the control circuit to the input of the open-loop current source to activate a pre-set number of the segmented fingers and to thus generate current at a corresponding first level. The current interacts with the external reference resistor R to generate a regulation voltage $V_{REG}$, at step 606. The resulting regulation voltage $V_{REG}$ is sensed and provided into the input of the comparator, where it is compared to $V_{REF}$, at step 608, and selected by the selector as a second input for the comparator. In one embodiment, the reference voltage level $V_{REF}$ corresponds to the desired regulation voltage level. Following the comparison, a determination is made as to whether the regulation voltage $V_{REG}$ is equal to the reference voltage $V_{REF}$, at step 610. If the voltages are not equal, then the control circuit increments the multi-bit current setting for the current source, at step 612, which results in a corresponding change in the regulation voltage $V_{REG}$ at the regulation node. The method iterates until VREG=VREF. At that point, the current value for the open-loop current source is saved as the calibrated current value, at step 614, and used for the calibration current sources involving the replica drivers.

Figure 6B:
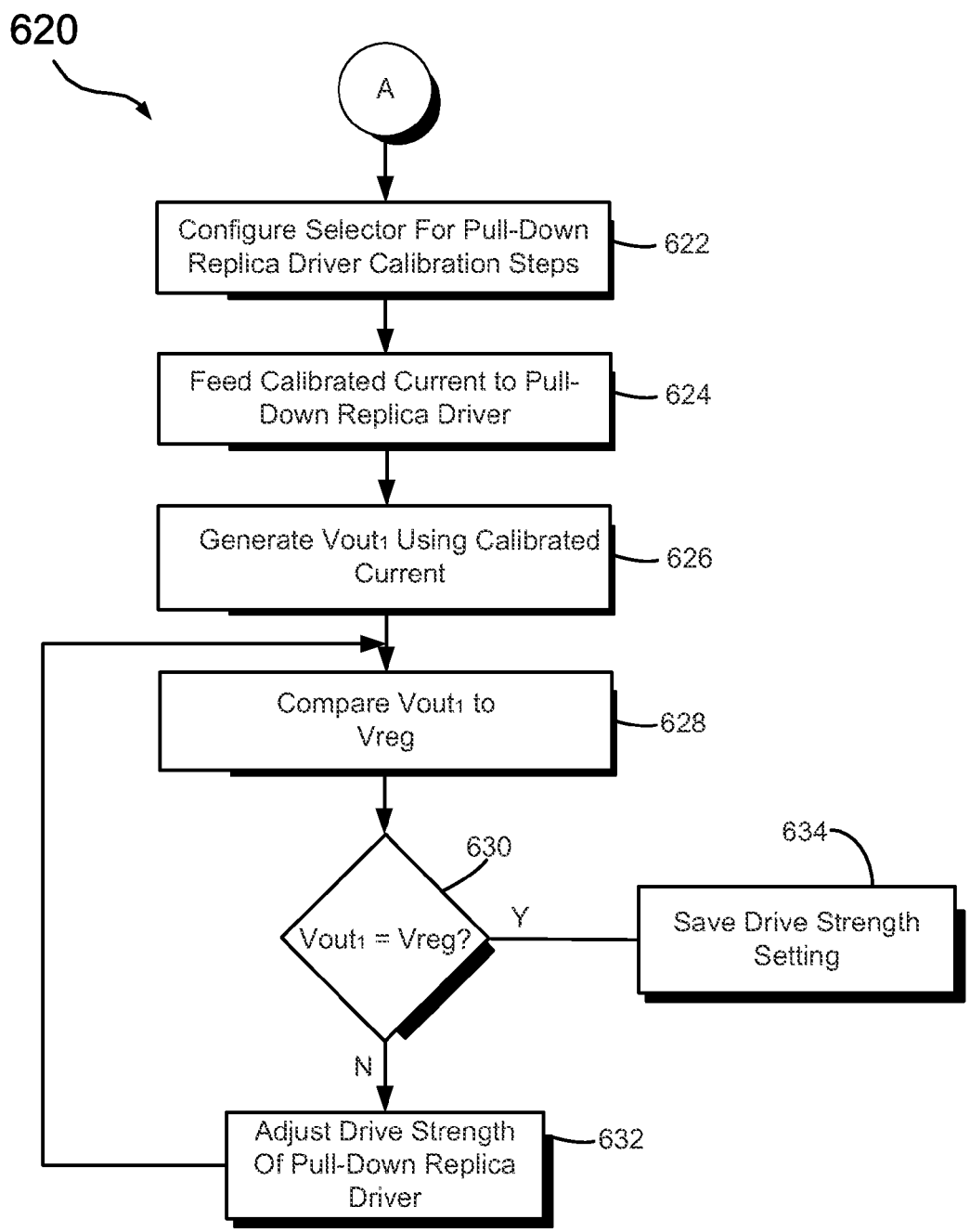
FIG. 6B illustrates a subsequent portion of the flowchart of FIG. 6A.

Once the open-loop current source achieves its calibration, at step 614, further calibration operations may proceed with the calibration of the replica driver circuits. FIG. 6B sets forth steps, generally designated 620, corresponding to the calibration of the pull-down replica driver 510, with bubble "A" representing a continuation from the open-loop current source calibration sequence of steps to the replica driver calibration steps. In one embodiment, the pull-down replica driver is calibrated first, such that its impedance value matches that of the external resistor R. The method begins by reconfiguring the selector, at step 622, to pass the voltage Vout$_1$ from replica node 518 as an input to the comparator for comparison to the voltage Vreg from the calibrated regulation node 516. Calibrated current is then fed to the pull-down replica driver circuit 510, at step 624, such that the output voltage Vout$_1$ is generated on the replica node 518, at step 626. The resulting output node voltage is then compared against the calibrated regulation voltage, at step 628, and a determination made as to whether $V_{out1}=V_{reg}$, at step 630. If not, then the control circuit decrements or increments the impedance of the replica driver by activating or deactivating additional impedance blocks (via codes sent along multi-bit path 534), respectively, within the driver, at step 632. The voltage generation, comparison and determination steps are iterated until the voltages are equal, or until they achieve a predetermined relationship. At that point, the impedance setting is saved, at step 634.

Figure 6C:
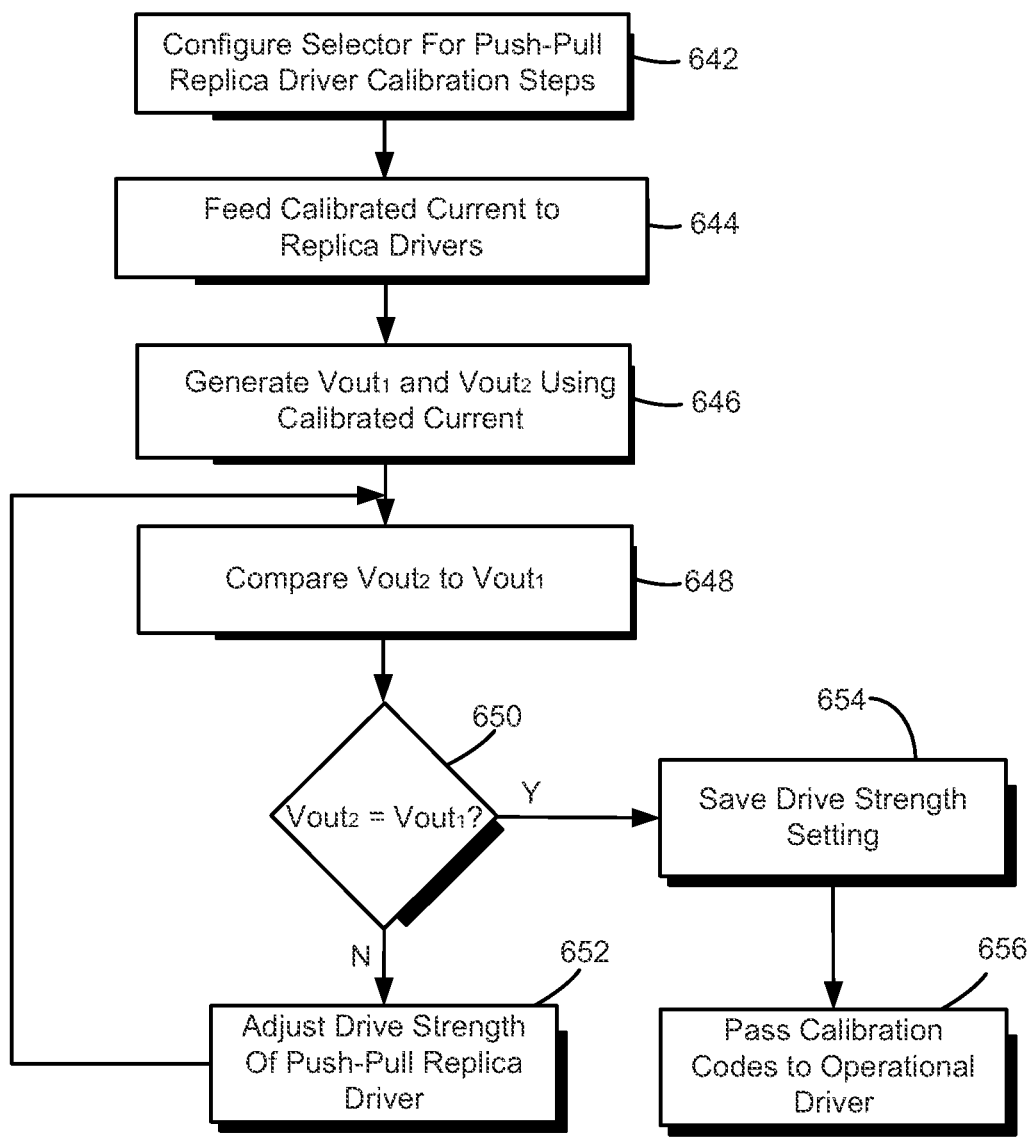
FIG. 6C illustrates a flowchart similar to FIG. 6B.

Calibrating the push-pull replica driver 512 is carried out in a similar manner to the pull-down replica driver described above, and follows the general method flowchart illustrated in FIG. 6C in accordance with steps generally designated 640. Note that the code for feeding the input to the pull driver element 538 was already set via the replica driver calibration described above. Thus, the steps below generally set out the calibration for the push driver element 536. The steps begin by configuring the selector to pass the replica driver output voltages Vout$_1$ and Vout$_2$ to the comparator, at step 642. Calibrated current is then fed to the replica drivers from the corresponding current sources, at step 644, such that the respective output voltages are generated, at step 646. The output voltages are then compared, at step 648, and a determination made whether the output voltages are equal, at step 650. The voltage Vout1 was previously calibrated with the pull-down driver 510 to match the regulated voltage $V_{REG}$. The comparison of Vout2 to Vout1 then becomes equivalent to a comparison of Vout2 to $V_{REG}$. If the voltages are not equal, the control circuitry adjusts the impedance of the push driver element, at step 652, and the comparison, determination, and adjustment steps iterated as necessary until the output voltages are equal. Once the drive strength settings for the push-pull replica driver transistors are saved, at step 654, the calibration codes (including the drive strength settings) for all of the replica driver transistors may be passed and made available for use by the operational driver, at step 656, during normal operation.

Once the impedance levels for the replica drivers 510 and 512 are set, the corresponding values are used as a prediction for the ODT impedance disposed remotely on the separate integrated circuit chip (not shown), as seen by the differential driver 406. The combined values of the calibrated replica drivers and the replica ODTs may then be used as a prediction for the output loading on the regulator that will result during data transmission.

Following calibration, the voltage regulator circuit 400 may be placed in a normal operation mode where it helps maintain a regulated voltage and supply current on the voltage regulator output node. As the differential driver 406 alternates from idling to data transmission, the change in output loading resulting from the changing operation is compensated through the quick supply of open-loop current (at a level corresponding to the calibrated level based on the predicted output loading). Supplemental current over a longer time interval is supplied by the closed-loop path 420, which monitors the nodes in real time, and provides a correction current at a slower but more accurate level.

In some embodiments, such as those employing a low-power mode of operation, the ODT circuit may be decoupled from the rest of the circuitry or may not exist, thus not contributing to the output load. In such applications, calibrating the ODT may be eliminated from the initialization process.

While the example presented above is set in a differential context, it should be understood that single-ended implementations may utilize the noted external reference resistor and calibration operations for calibrating both the regulator current sources and the driver ODT circuitry.

Figure 7:
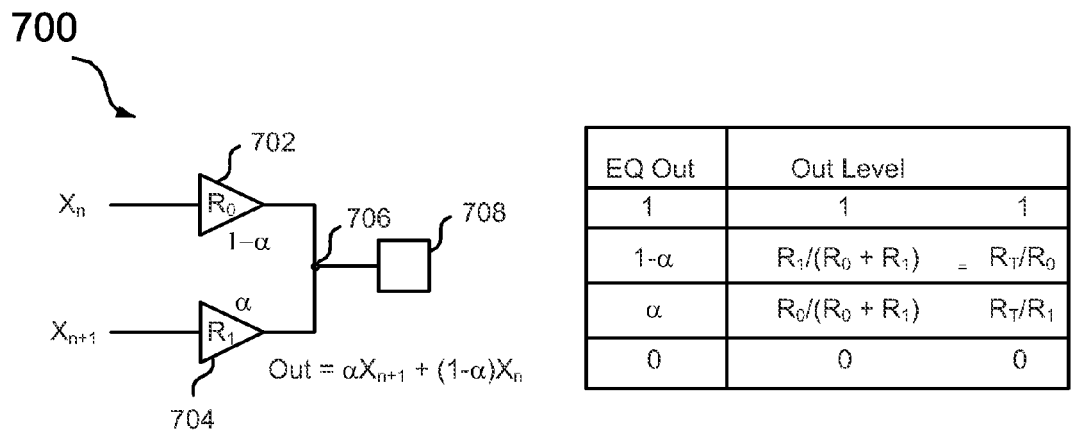
FIG. 7 illustrates a high-level impedance network involving a main driver and an equalizing driver.

FIG. 7 provides a high-level output impedance network 700 (with associated output table) involving a main driver 702 and an equalizer driver 704. Both drivers have respective outputs coupled to a summing node 706 that ties to an output pad 708. The output table of FIG. 7 shows the output level as a function of the main and post tap impedances. For one example, the main tap exhibits an impedance of $R_0$ and the post tap has an impedance of $R_1$. Assuming that the parallel arrangement of $R_0|R_1$ is $R_T$ (such as 50 ohms), and also assuming the post tap has a negative polarity, when the main and post signals agree at a "high" logic level, the output reduces to $R_T|R_0$, and if they agree at a "low" logic level, the output reduces to RT|R1.

Figure 8:
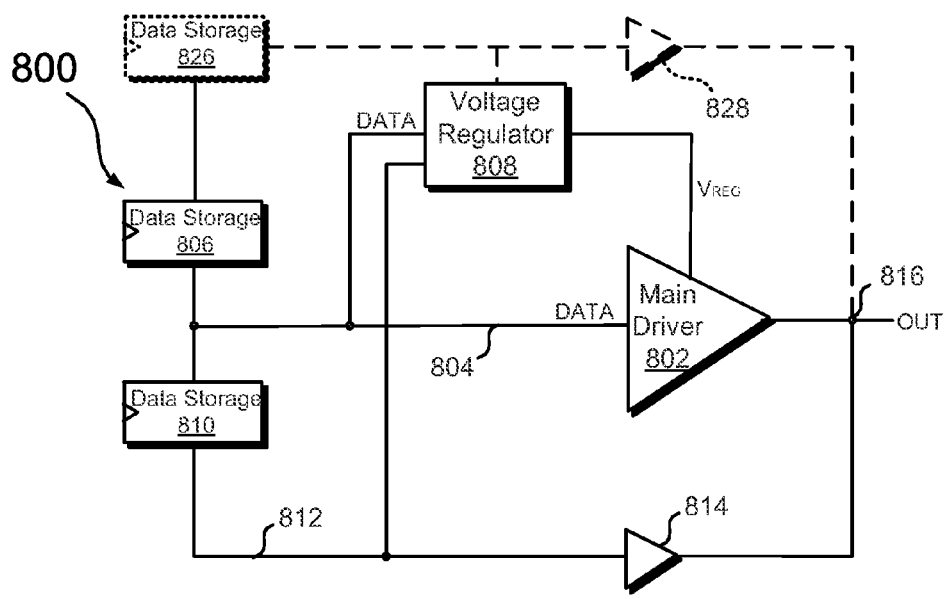
FIG. 8 illustrates an embodiment of an equalizing transmitter circuit.

FIG. 8 illustrates a high-level voltage mode equalizing driver architecture 800 that employs many of the concepts described above. The architecture includes a main driver 802 having an input to receive data along a data path 804 from a first data storage circuit 806. A voltage regulator 808 couples to the main driver and the data path to receive a copy of the data sent to the driver, and to provide a regulated power supply voltage $V_{REG}$ for the driver output. To provide equalization at the output of the main driver, a second data storage circuit 810 provides a delayed copy of the data via path 812 to an equalizer driver 814. The outputs of the main driver and equalizer driver both couple to a summing node 816.

While the above disclosure specifically describes the context of a negative post-tap scenario (output reduced when the main and post have the same polarity), a positive polarity for the post-tap value is also envisioned, and shown as an optional configuration with data stage 826, and equalizer driver 828. In a differential context, it will be appreciated that the structures are very similar as is understood by those skilled in the art. Moreover, while FIGS. 7 and 8 illustrate a high-level architecture showing only a single tap, multiple taps may be employed consistent with the principles herein.

While equalization beneficially compensates data transmissions in a manner that minimizes signal degradation, the equalizing adjustments to the output driver voltage generally result in changes to the load impedance presented to the regulator. As a result, the current drawn from the regulator undergoes data dependent fluctuations that, if left uncompensated, may undesirably affect the regulator voltage and correspondingly affect the output signal voltage. This is to be contrasted to the impedance presented to the channel, which is generally constant, and thus data independent. These effects on the output current may be compensated for by accurately predicting the output impedance changes in advance, and providing the information to the regulator circuit to provide sufficient compensation current during equalizing events.

Figure 9:
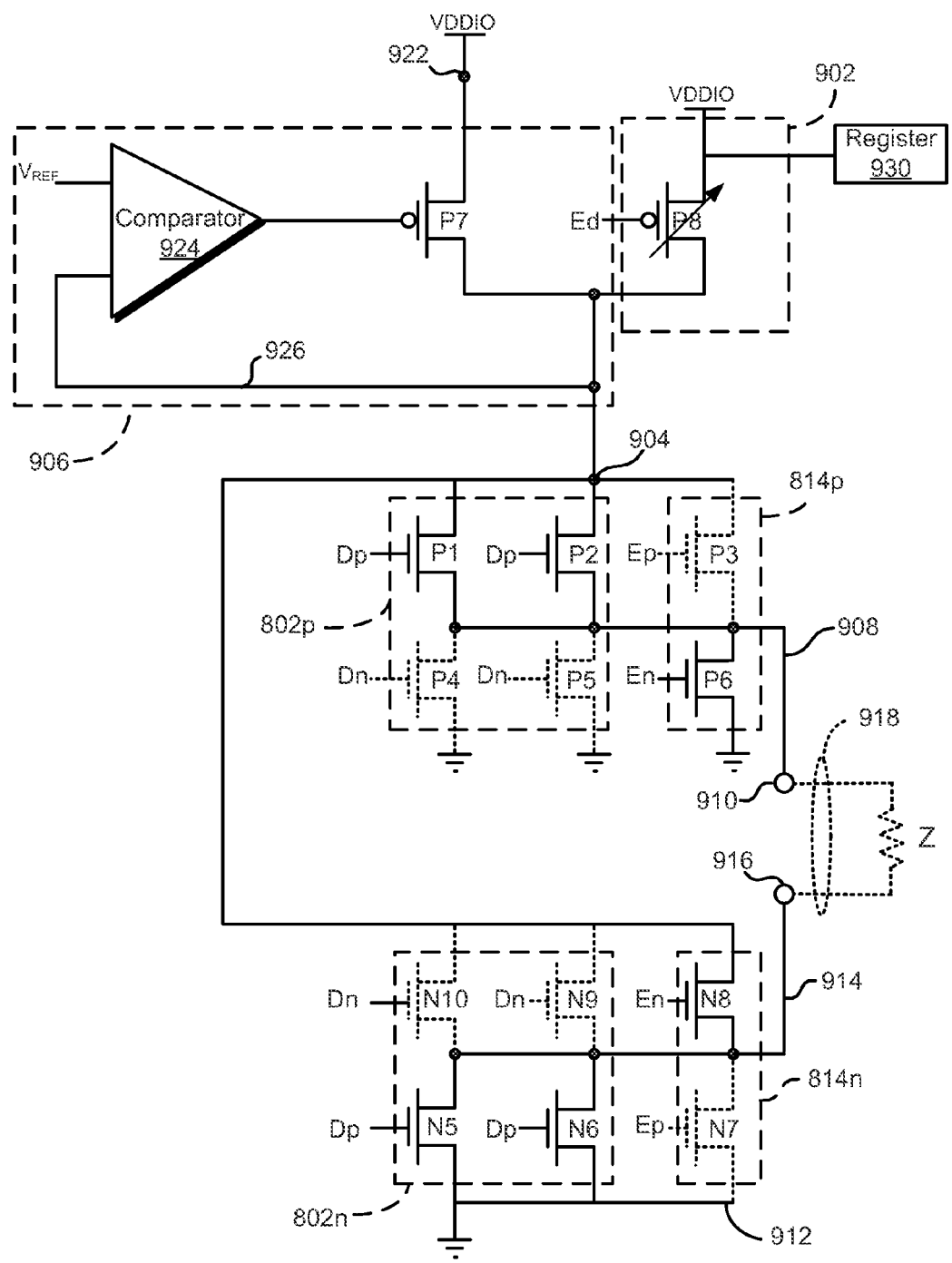
FIG. 9 illustrates one embodiment of a voltage regulator circuit for use with the equalizing transmitter circuit of FIG. 8.

FIG. 9 illustrates further detail of one embodiment of the voltage regulator circuit 808, and a representative portion of drivers 802 and 814, shown in FIG. 8. At a high level, the regulator circuit employs an open-loop current source path 902 responsive to a signal indicating an equalizing event to provide high-speed compensation current into a regulation node 904. A closed-loop current path 906 provides a relatively stable current into the regulation node to supplement the open-loop current source over a longer time interval, but with higher accuracy.

Further referring to FIG. 9, the main driver circuitry 802 (FIG. 8) is represented by half of a differential H-bridge driver configuration. A first portion 802p of the circuitry includes N-type MOS "pull-up" transistors P1 and P2 coupled in parallel between the regulation node 904 and an output path 908 connected to a "P" output pad 910. A corresponding "pull-down" set of transistors P4 and P5 couples to the output path 908 and ground. The pull-up transistors respond to an input signal Dp, while the pull-down transistors respond to an input signal Dn, which is the complement to Dp. A second portion 802n of the main driver circuitry 802 includes pull-down transistors N5 and N6 coupled in parallel between a pull-down regulation node 912 and an output path 914 connected to an "N" output pad 916. Corresponding "pull-up" transistors N9 and N10 driven by data inputs Dn couple to the output path 914 and the regulation node 904. The P and N output pads are for coupling to a differential link 918 that connects the driver to a corresponding receiver having an associated impedance Z.

With continued reference to FIG. 9, a first portion 814p of the circuitry corresponding to a portion of the equalizing driver 814 (FIG. 8) includes a first N-type MOS "pull-up" transistor P3, responsive to input signal Ep, coupled between the regulation node 904 and the output path 908, and an N-type MOS "pull-down" transistor P6, responsive to input signal En, coupled between the output path 908 and ground. Signals Ep and En are complementary. A second portion 814n of the circuitry corresponding to another portion of the equalizing driver 814 includes a first N-type MOS gate N7 coupled between the output path 914 and the pull-down regulation node 912, and a second N-type MOS gate N8 coupled between the output path 914 and the regulator node 904. The phantom indications in the figures are intended to reflect the equalizing driver transistors as selectively activated, in one embodiment, only during equalizing events. In one embodiment, equalizing events occur when an imbalance occurs between the pull-up or pull-down portions of the main driver circuitry and the equalizing driver circuitry. The imbalance leads to a decreased swing at the output and higher current drawn from the regulator.

Further referring to FIG. 9, the open-loop path 902 employs a P-type current driver P8 having a programmable adjustment capability and forms the output stage of a digital-to-analog-converter (not shown). The current driver includes an input responsive to an XNOR function ($a \cdot e + \overline{a} \cdot \overline{e}$), where "a" represents a given data bit level from a driver data pattern, and "e" represents a given equalizer bit level from an equalizer driver pattern. The current driver feeds its output to the regulator node 904. Another way of stating this is that the open-loop current source is enabled simultaneously with an equalizing event. In one embodiment, where multiple taps are employed in the equalizing driver, several distinct equalizing events may occur, each of which may warrant a distinct level of current injection.

The closed-loop regulator path 906 also includes a P-type current driver P7 coupled between a chip I/O power supply node 922 and the regulator node 904. The current driver receives an input from a comparator 924 that represents the result from a comparison of a sensed regulator node voltage from path 926 to a reference voltage $V_{REF}$.

Prior to operation, the open and closed-loop current sources are pre-set to levels based on known output impedances seen at the output of the driver. In one embodiment, the closed-loop path is configured to provide a relatively stable and accurate output load current for situations where the equalizing driver is inactive (non-equalizing events). The open-loop current source is then configured to supplement the closed-loop source as-needed during equalization events. Setting the level of open-loop current involves, in one embodiment, programming the DAC to generate a level of compensation current sufficient to satisfy the anticipated output load current changes. Generally, the amount of open-loop current to provide depends on the expected change in output impedance that takes place during the equalizing events. Thus, by determining the various output impedance configurations for the various operating conditions, calculating the corresponding changes in load current due to the impedance changes, and storing those current values for use by the DAC, high-speed open loop current compensation for equalizer events can be straightforwardly implemented.

Once the predicted changes to the output impedance and output load current are determined, the values may be loaded into a local storage resource, such as a programmable register or on-chip nonvolatile storage circuit 930. The stored values may then be accessed for use by the DAC as current drive settings during normal operation. Alternatively, a logic circuit may be incorporated instead of the memory to map the bit stream to the DAC input.

In operation, data bit sequences are transmitted by the main and post tap drivers generally in accordance with known transmit equalization steps. Each 2-bit data sequence may be thought of as either a transition sequence, where the data transitions from one level to the other (such as from a "0" to a "1"), or a non-transition sequence, where the data bits remain at the same level. In one embodiment, equalizing events occur only during non-transition sequences. Thus, operation of the circuit varies depending on the current data bit and the preceding data bit.

Referring back to FIG. 9, for 2-bit sequences involving data bit transitions, no equalization event occurs. Another way of expressing this is where the data bit pattern, such as a pull-up pattern represented by "Dp", is equal to the equalizer pull-up bit pattern, represented by "Ep." As a result, main driver pull-up transistors P1, P2 and N5, and N6 are activated as well as equalizing driver transistors P3 and N7. Equalizing driver transistors P6 and N7 are deactivated since the data and equalizer bit patterns are the same. Assuming that an output load of Z is coupled to the output pads 910 and 916, the output load current drawn as a result of the activation of transistors P1-P3 and N5-N7 is of a level that can be sufficiently sourced by the closed-loop path 906 of the voltage regulator. The open loop path 902, on the other hand, receives an XNORing of the 2-bit data sequence (current bit and most recent bit), which for a transition sequence results in transistor P8 being deactivated, thus rendering the open-loop current path offline.

Where the bit sequence reflects a non-transition bit scenario, the operation of the circuit of FIG. 9 changes significantly. In such a situation, the pull-up data pattern Dp differs from the equalizer pull-up bit pattern Ep. This results in a deactivation of equalizer transistors P3 and N7, with a simultaneous activation of equalizer transistors P6 and N8. The resulting short current path introduced by P6 and N8 contributes to a change in impedance in the network, causing an increase in current above the nominal current sourced by the closed-loop path 906. The bit sequence, being received by the input of the open-loop current path 902 in the form of an XNOR control signal, causes the activation of segmented transistor P8. This generates a supplemental current into the regulation node 904 to compensate for the additional current drawn by the equalizing event.

By configuring the closed-loop path 906 to supply a default current for non-equalizing events, and supplementing the current with open-loop current only during the equalizing events, several advantages are observed. First, power consumption is minimized by enabling the drivers to enter a power-down state when not transmitting data through the fast-response of the open and closed-loop paths. Further, signal integrity incurs little to no impact through the addition of the relatively straightforward open-loop path. Moreover, simultaneous switching output (SSO) effects are minimized through use of the regulator design.

Figure 10:
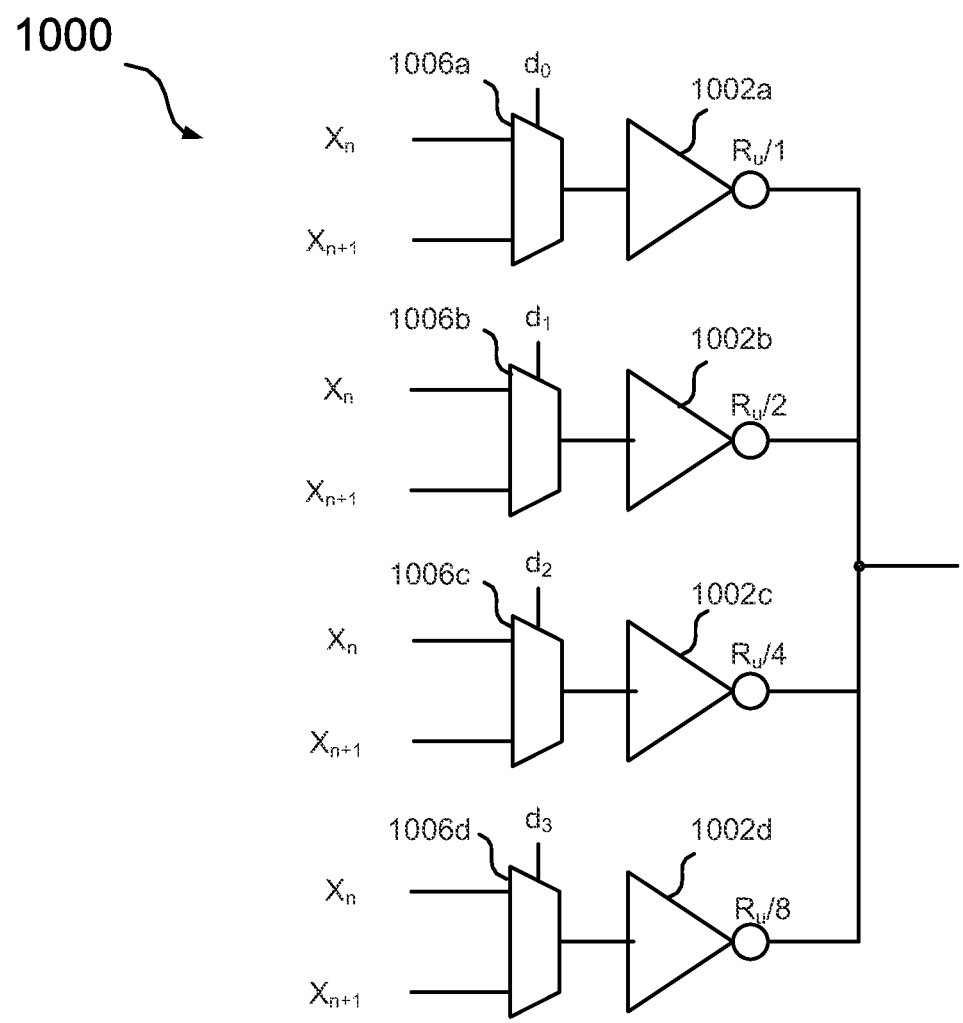
FIG. 10 illustrates one embodiment of a circuit to program the impedance values R0 and R1 of FIG. 7.

FIG. 10 illustrates one embodiment of a single tap equalizer 1000 that selectively feeds main or post tap equalization signals $X_n$ and $X_{n+1}$ from a plurality of selectors 1006a-1006d to driver segments 1002a-1002d. The selectors are responsive to control inputs d0-d3 to pass the main or post tap inputs $X_n$ and $X_{n+1}$ through to the driver segments. This provides the ability to make the values of the main and post driver impedances R0 and R1 programmable.

Although much of the discussion on the various embodiments presented herein focuses on voltage regulation, it is to be understood that the circuitry described herein generally pertains to output load regulation, regardless of whether the regulation is in terms of voltage, current or impedance. Moreover, specific circuit implementations, such as the transistor arrangement of FIG. 9, may employ multiple transistors in series or parallel or any combination thereof with appropriate logic for calibrating them to a specific impedance.

Referring now to FIGS. 11-16, in some situations, the load impedance associated with the transmission line from the point of view of the transmitter may be very high, where it approximates an "unterminated" load condition. For high impedance or "unterminated" load applications, the load current drawn during data transmission is dynamic in nature and generally occurs only during the transition from a data low level to a data high level. This contrasts to "terminated" load situations (load impedances on the order of between 20 to 100 ohms) where the load current is drawn during the entire time interval corresponding to a data bit interval, including the steady state portion of the waveform. Further, where a fairly short interval is involved to generate compensating load current, the capacitance $C_r$ associated with the voltage regulation node may be significantly reduced, resulting in beneficial die area reduction.

Unterminated load conditions are addressed, in one embodiment, by employing a voltage regulator with an open-loop current generation circuit. The current generation circuit responds to data inputs to provide a data transition-dependent current. This enables the voltage regulator to carry out its regulation function as needed during data transitions, thereby saving power during non-transition states.

Figure 11:
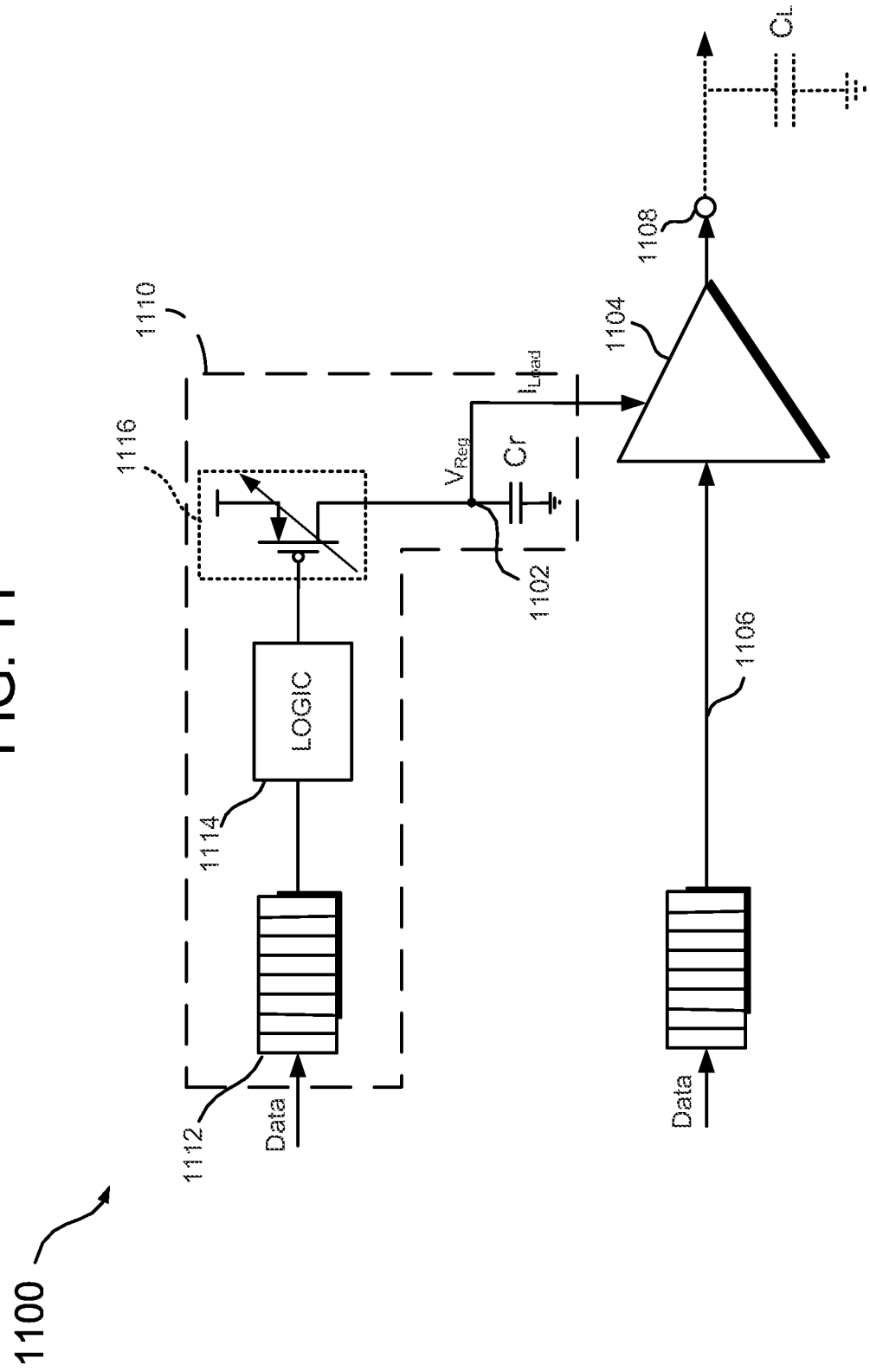
FIG. 11 illustrates a further embodiment of a voltage regulator for use in the transmitter circuit of FIG. 1.

FIG. 11 illustrates a voltage regulator 1100 suitable for use with an integrated circuit for high impedance or "unterminated" output loads. The regulator provides a regulated voltage $V_{REG}$ at a voltage regulator output node 1102 for use as a power supply for a transmitter 1104 that transmits data sequences provided by an on-chip data path 1106 to an output pin 1108. The regulator provides an open-loop path 1110 having an input data buffer 1112 to receive data signals corresponding to a data sequence being queued for data transmission by the data transmitter 1104.

The voltage regulator open loop path 1110 includes logic 1114 that in some embodiments modulates input data to generate control signals for application to a current source circuit 1116. In other embodiments, the logic steers charge to the regulation node 1102 without the need for a separate current source. Several implementations of the logic are disclosed in further detail below.

Figure 12:
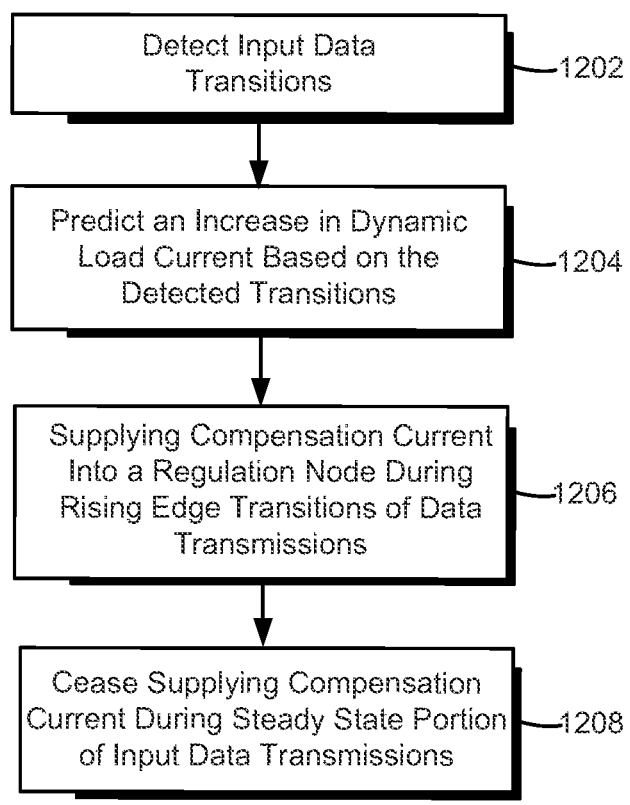
FIG. 12 illustrates a high-level flowchart of a method of regulating voltage with the regulator of FIG. 11.

FIG. 12 illustrates steps that correspond to operation of the voltage regulator of FIG. 11. To reiterate, the operation is optimized to provide compensation current to the regulation node only when needed. For unterminated lines, this is during the rising edge of an input data transition. The method generally involves detecting input data rising edge transitions, at step 1202, then predicting an increase in dynamic load current based on the detected transitions, at step 1204. As explained earlier, data transmissions from the transmitter cause dynamic load current draws during the rising edge transitions of the data transmissions. The predicting enables compensation current to be supplied into the voltage regulation node, at step 1206, during the dynamic current draw. Supplying the additional current in this manner prevents the regulation node voltage from dropping below acceptable levels during the changing current load, which might impact data transmission performance. The supply of compensation current ceases, at step 1208. By supplying current only during the dynamic loading interval, power dissipation due to the regulator is significantly less in comparison to a regulation scheme for terminated loads. This provides a corresponding improvement in power efficiency.

Figure 13:
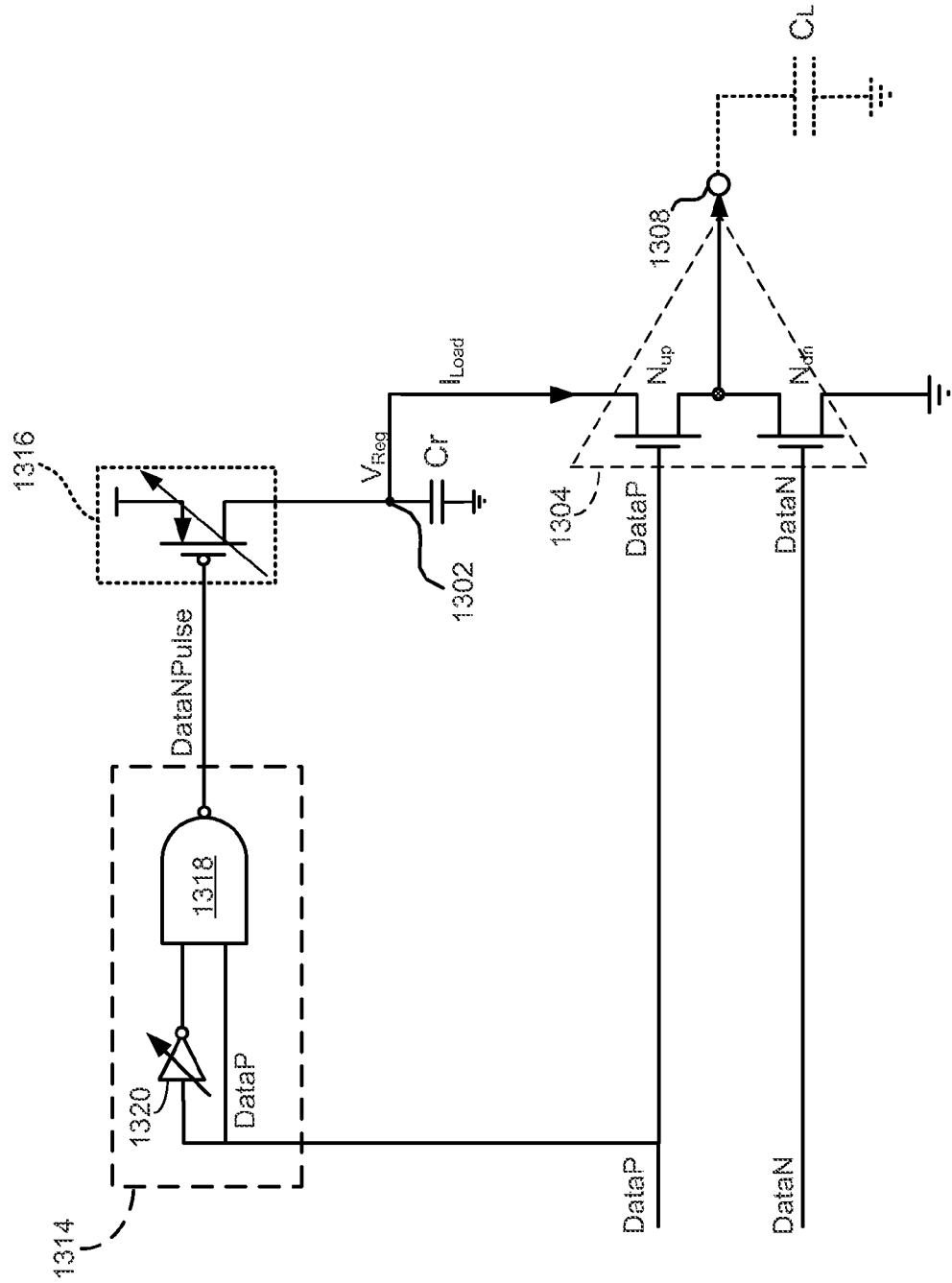
FIG. 13 illustrates one implementation of the voltage regulator of FIG. 11.

FIG. 13 illustrates further detail regarding one embodiment of the voltage regulator of FIG. 11. For one embodiment, an N/N transmitter 1304 is employed to transmit differential data signals having respective complementary signal components DataP and DataN. For the DataP component of a differential data bit, the rising edge transition corresponds to the leading edge of the data bit. For the DataN component, the rising edge corresponds to the trailing edge of the differential data bit. The N/N transmitter generally includes respective pull-up and pull-down drivers Nup and Ndn that dynamically draw load current from a regulation node 1302 based on the rising edge transitions of the differential data signals transmitted from an output node 1308. The signals propagate along an unterminated transmission line with a representative load capacitance $C_L$.

Further referring to FIG. 13, in order to compensate for the dynamic current load $I_L$ resulting from the rising edge data transitions of the data components DataP and DataN, in one embodiment, regulator logic 1314 is employed that utilizes pulse-width-modulation (PWM) circuitry to generate control signals for application to a current source 1316. The logic can include a NAND gate 1318 with a first input that receives the DataP component of an input data signal directly and a second input that receives a delayed version of the DataP data component via a variable delay circuit 1320. The output of the NAND gate couples to an inverting input of the current source 1316. With the NAND gate receiving DataP components as inputs, the generated output corresponds to a DataN component.

The variable delay circuit 1320 may be realized through any one of a number of techniques, including programmable delay lines, buffer circuitry, or the like. Employing the delay circuit in the signal path of one of the inputs allows a pulse to be created at the NAND output that corresponds to the narrowed overlap in the signals caused by the delay. The delay circuit, combined with the NAND gate 1318, creates a pulse generation circuit based on the input data component DataP.

With additional reference to FIG. 13, as explained above, the delay value applied between the inputs to the NAND gate 1318 defines a pulse width for a narrow pulse generated at the NAND output for application to the current source 1316. With the current source having an inverting input, the narrowed DataN pulses from the logic activate the current source as the transmitter transmits DataP rising edge transitions of the data. In this manner, as dynamic load current is drawn by the transmitter 1304, a corresponding dynamic load current is supplied into the regulator node 1302 by the current source 1316.

The pulse-width modulation logic 1314 described above provides a flexible way to programmably provide a precise amount of current to the regulator node 1302 during rising edge data transitions. Adjustments may be carried out through an initialization or calibration mode of operation where the load current can be determined for a given data transition, and the pulse-width optimized to span the transition interval for optimum power efficiency. During calibration, the regulation voltage $V_{REG}$ can also be compared to a reference voltage in order to appropriately trim or adjust the current generated by the current source. Further details regarding circuitry to carry out an embodiment of the calibration are described below, with respect to FIGS. 14 and 16.

Various parameters associated with the PWM-based voltage regulator circuit may be expressed by the following charge, power and efficiency relationships:

$$\Delta Q_{L \to H} = (V_{DD} - V_{REG})/R_{pull-up} * T_{PulseWidth}$$

where:

$\Delta Q_{L \to H}$ is the charge that is delivered from $V_{DD}$ to $V_{REG}$ for every low-to-high data transition;

$R_{pull-up}$ is the resistance associated with the current source; and $T_{PulseWidth}$ is the pulse width time interval of the pulse generated by the PWM logic.

$$P_{VsReg} = (f_{L \to H} * V_{DD}(V_{DD} - V_{REG}) * T_{PulseWidth})/R_{pull-up}$$

where:

$P_{VsReg}$ is the intrinsic power consumption of the voltage regulator; and $f_{L \to H}$ is the frequency of the rising edge data transitions.

$$\eta_{Signaling} = V_{REG}/V_{DD}$$

where $\eta_{Signaling}$ is the efficiency of the regulator.

Over time, the circuit parameters associated with the voltage regulator of FIG. 13 may become susceptible to timing and/or voltage/current drift. This may become a significant problem in circumstances where substantial idle time persists between data transmissions. Drift may undesirably cause offsets in the desired timing, voltage and/or current profiles during operation. To compensate for drift, a closed-loop circuit may be employed, such as that shown in FIG. 14, to cooperate with an open-loop circuit to adjust the current supplied by the voltage regulator node.

Figure 14:
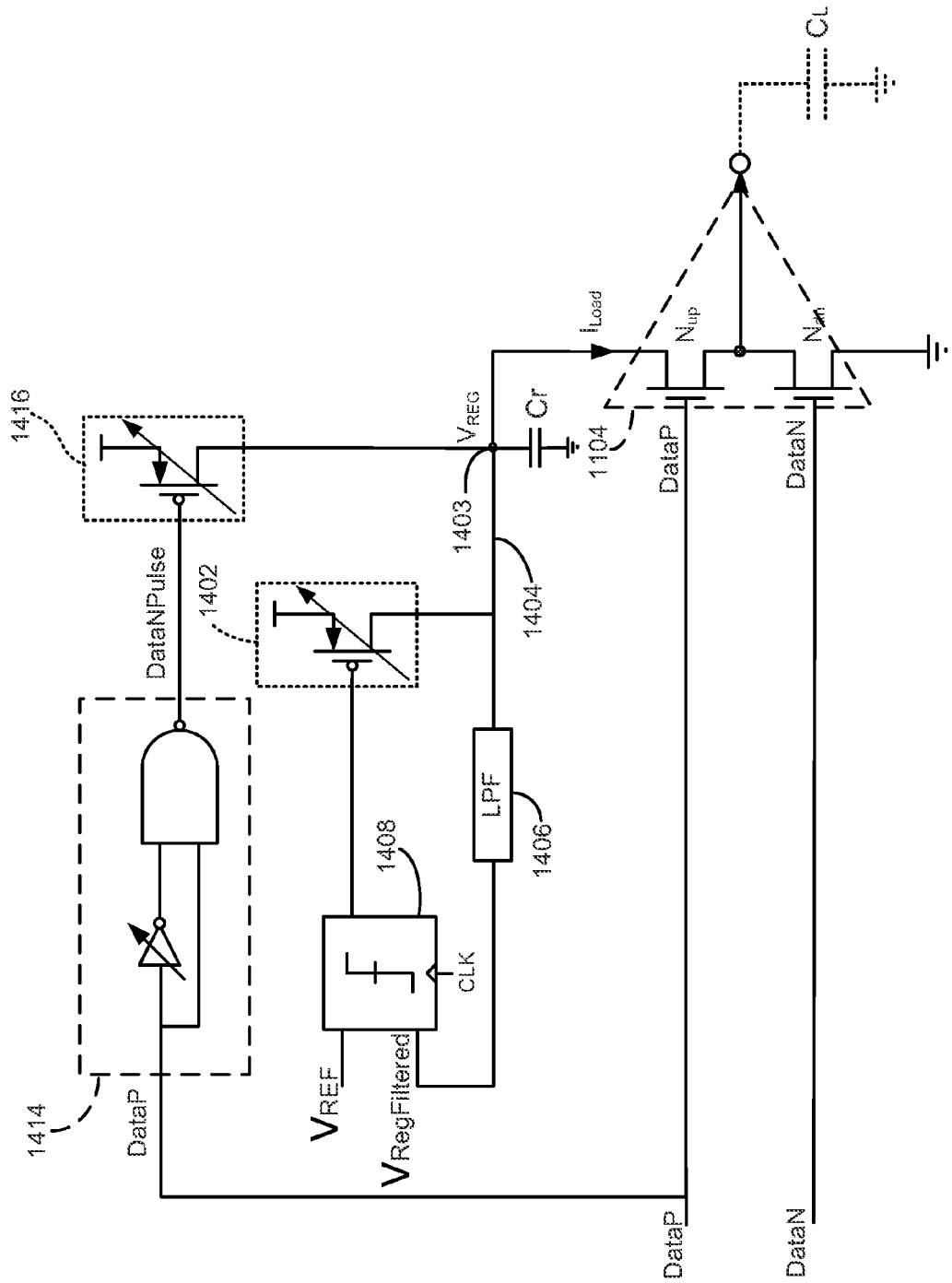
FIG. 14 illustrates the voltage regulator of FIG. 13 with an optional closed loop feature.

As depicted in FIG. 14, one embodiment of a closed-loop circuit includes a variable current source 1402 having an output coupled to a regulation node 1403 via feedback path 1404. A low-pass filter 1406 disposed in the path provides a smoothing function such that high-frequency changes at the node are ignored, allowing for a more deliberate response with higher accuracy. In one embodiment, the feedback path is fed to one input of a sampling comparator 1408. A second comparator input receives a reference voltage $V_{REF}$ for comparison to the regulator voltage $V_{REG}$. The sampler responds to a sampling clock CLK to sample both inputs and detect whether the regulation voltage meets a threshold value defined by the reference voltage. The sampling clock limits the bandwidth of the feedback loop and works in complement with the filter 1406 to prevent oscillation. One embodiment of the filter may be implemented in digital circuitry, which could be effected by moving the filter between the comparator (or a sampling flip-flop) and the current source 1402. That is, the comparator (or a sampling flip-flop) would output a raw unfiltered digital signal to digital circuitry that has a filter function (possibly adjustable). In this sense, the concept of using CLK to limit feedback bandwith is implicit because all the digital circuitry would use that CLK. The sampler output, when in a negative state ($V_{RegFiltered} < V_{REF}$) drives the current source, which feeds supplemental current into the regulation node 1403 to bring the regulation voltage $V_{Reg}$ up to the reference voltage level. Other variations, not shown, in the circuit may provide for the current source sinking current in conditions where the regulation voltage may temporarily exceed the reference voltage. Also, instead of a discrete time sampler, a continuous time comparator may be employed to carry out the comparator functionality.

Figure 15:
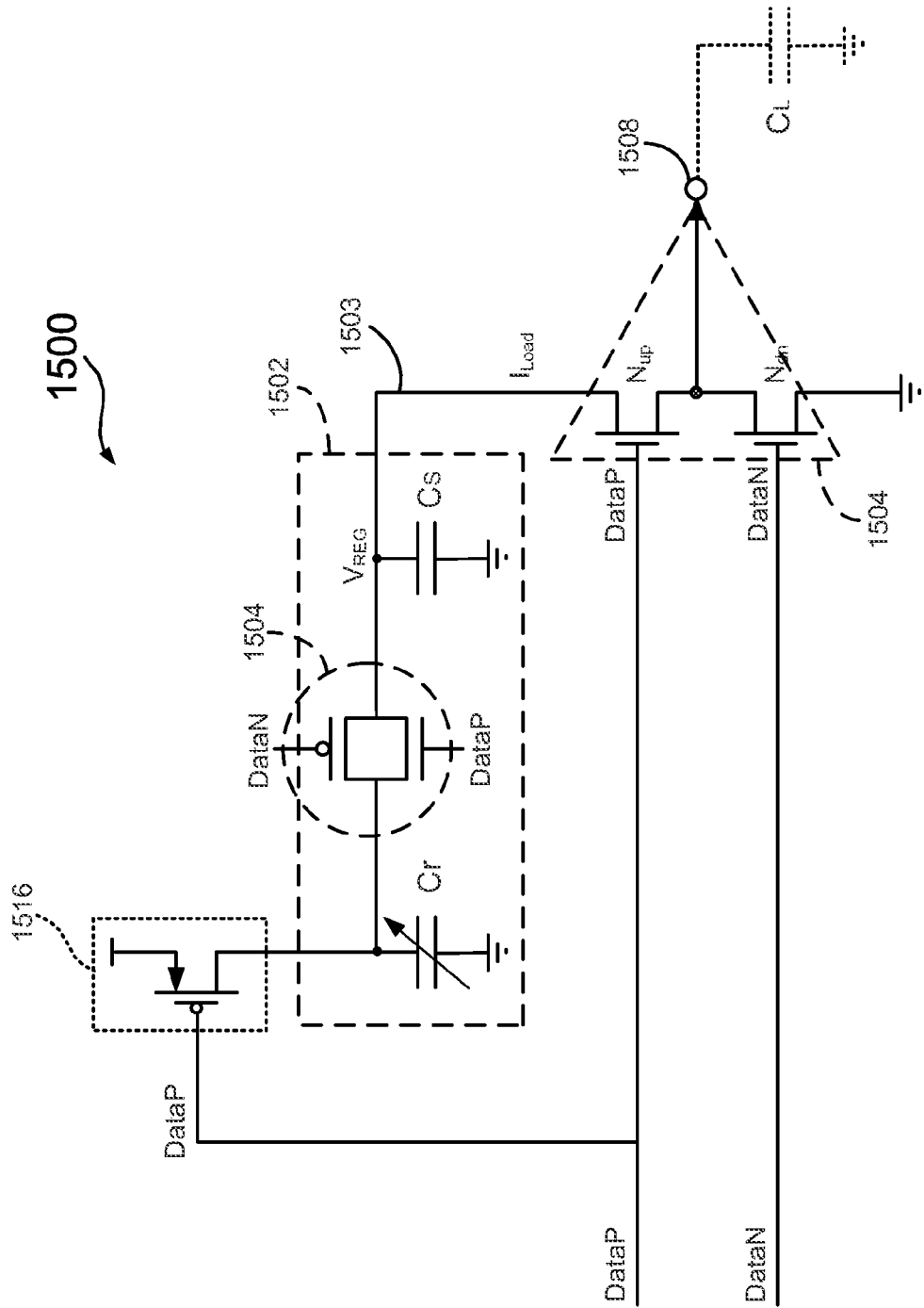
FIG. 15 illustrates an alternative implementation of the voltage regulator of FIG. 11.

FIG. 15 illustrates a further embodiment of a voltage regulator, generally designated 1500, optimized for high impedance or unterminated transmission line applications. Similar to the previously described embodiment illustrated in FIGS. 13 and 14, an N/N transmitter 1504 transmits data via output pad 1508 across a high impedance or unterminated transmission line. The data transmissions by the transmitter dynamically draw load current from a regulator node 1503 during the rising edge transitions of the input data. By predicting the dynamic load current and providing compensating load current at the regulator node, the regulation voltage $V_{REG}$ at the node can remain substantially constant during dynamic load current draws.

Compensating load current is generated via a switched-capacitor logic circuit 1502 coupled to the output of a variable current source 1516. The current source is generally similar to the current sources described earlier, and feeds current into the regulation node 1503 in response to the rising edge of a data signal. Coupled to the regulation node is a variable regulator capacitor circuit $C_r$ that provides capacitive charge storage and delivery capabilities as described more fully below. A switch 1504 responds to respective complementary components DataP and DataN of a differential input data signal to carry out a two-stage charge and delivery process between the regulation capacitor circuit Cr and a source capacitor circuit Cs.

In operation, the respective rising and falling data edge transitions of the complementary data signal components DataP and DataN create events that initiate respective stages of the charge and delivery process to generate dynamic load current for the transmitter during rising edge data transitions.

When the data is in a non-transitioning state, the current source, which is actually a switch in this implementation, is active, providing charge into the regulator capacitor $C_r$. During a rising edge data transition, the current source deactivates, and the switch capacitor activates, allowing the charge from the regulator capacitor circuit $C_r$ to "dump" or deliver the charge to the source capacitor Cs. The charge on the source capacitor circuit Cs is available for dynamic load current as the transmitter transmits data signals, and allows the regulation node voltage $V_{REG}$ to remain relatively constant during the data transmissions.

Similar to the PWM-based voltage regulator described previously, various parameters of the switched-capacitor voltage regulator 1500 may be expressed by the following charge, power and efficiency relationships:

$$\Delta Q_{L \to H} = (V_{DD} - V_{REG}) * Cr$$

$$P_{VsReg} = f_{L \to H} * C_{Load} * V_{DD} * V_{REG}$$

$$\eta_{signaling} = V_{REG}/V_{DD}$$

Figure 16:
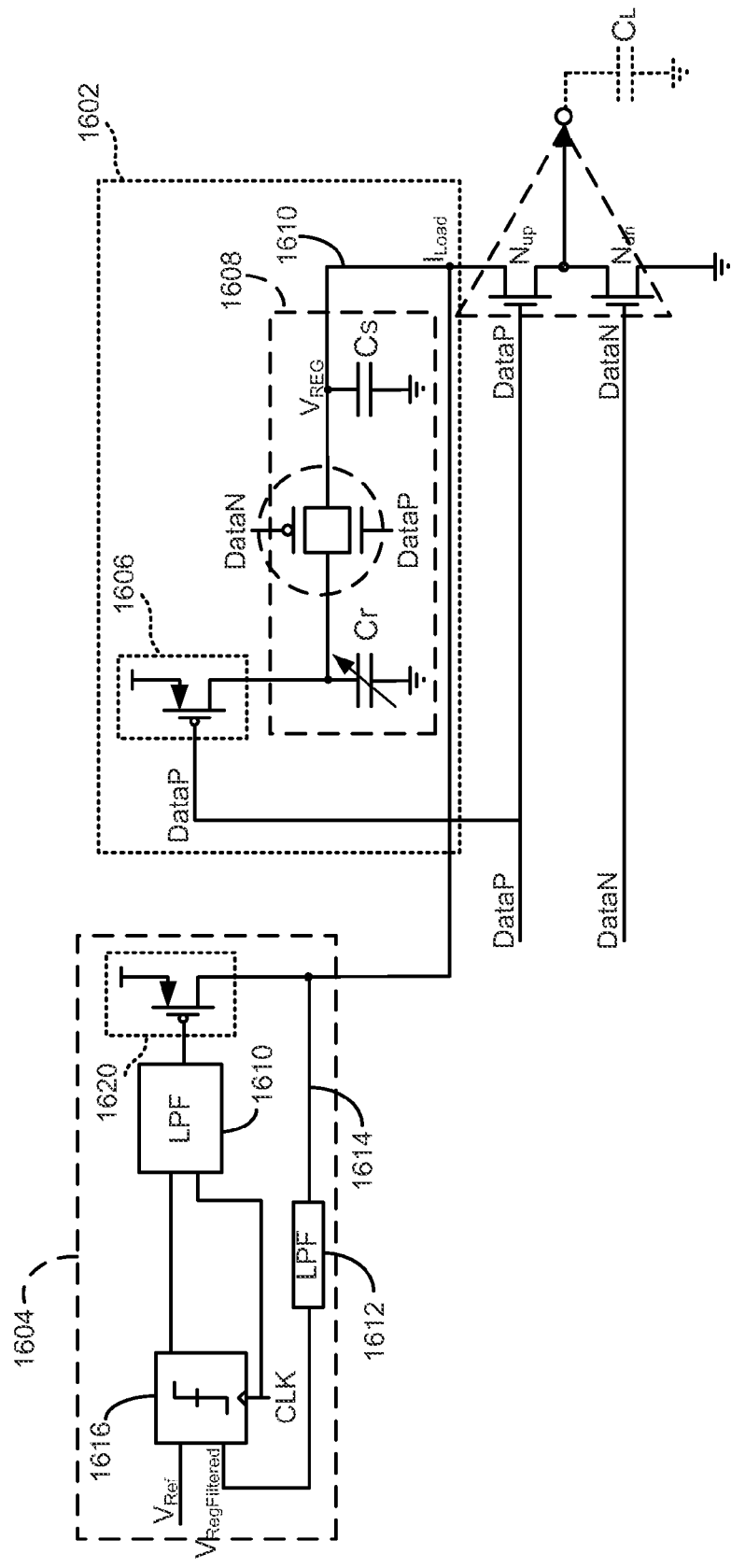
FIG. 16 illustrates the voltage regulator of FIG. 15 with an optional closed loop feature.

FIG. 16 illustrates an open-loop switched-capacitor voltage regulator 1602 combined with a closed-loop circuit 1604 to compensate for timing and/or voltage/current drift. The open loop regulator 1602 is similar to that described in FIG. 15, incorporating a current source 1606 responsive to data input signals DataP to drive a switched-capacitor circuit 1608. The switched-capacitor circuit provides highly responsive load current to a regulator node 1610. In one specific embodiment, the closed-loop 1604 includes an analog low-pass filter 1612 disposed in a feedback path 1614 to filter high-frequency changes in the regulator voltage, allowing for a slower responding and more accurate circuit. The feedback path 1614 couples to one input of a sampling comparator 1616 and feeds the comparator a filtered regulator voltage signal $V_{RegFiltered}$. A second comparator input receives a reference voltage $V_{REF}$ for comparison to the filtered regulator voltage. The sampler responds to a sampling clock CLK to detect whether the regulation voltage deviates from a threshold value defined by the reference voltage.

In one specific implementation, digital logic in the form of a low-pass-filter (such as a NAND gate) 1610 is disposed at the output of the sampler 1616 and includes a first input to receive the sampling clock and a second input to receive the sampler output. The sampling clock input provides a maximum rate signal for supplying extra supplemental current into the regulator node. In an alternative embodiment, the analog low pass filter may be omitted from the feedback path 1614 and employed as additional digital logic in the filter 1610. The output of the digital low-pass filter feeds an inverting input of a second current source 1620. The output of the second current source feeds its output current into the regulation node 1610 responsive to the low-pass filter output. Supplemental compensation current is provided into the node when $V_{RegFiltered} < V_{REF}$ over longer intervals. The merged configuration provides highly responsive compensation current during rising edges of the data transitions, while also monitoring for drift to provide supplemental compensation as needed.

Figure 17:
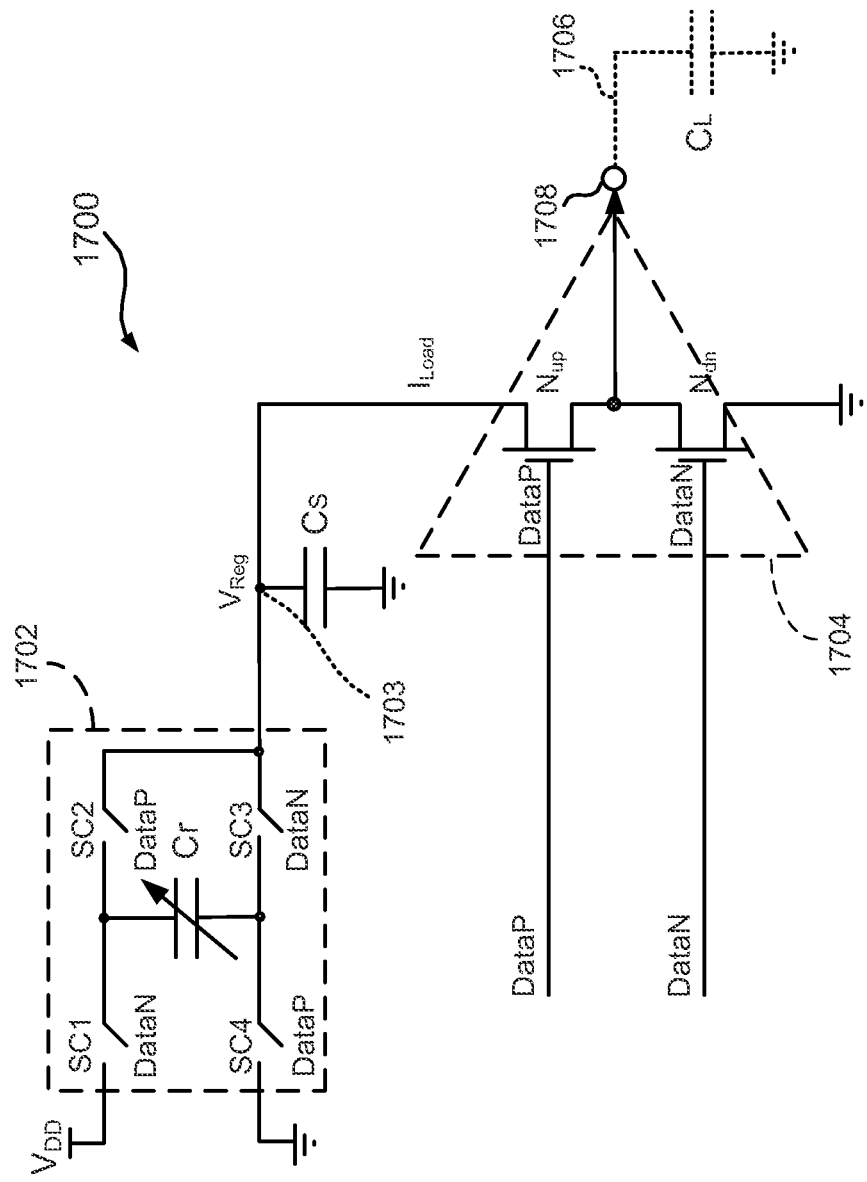
FIG. 17 illustrates a further implementation of the voltage regulator of FIG. 11.

FIG. 17 illustrates yet another embodiment of a voltage regulator, generally designated 1700, that employs flying capacitor logic 1702. Like the previously described embodiments corresponding to FIGS. 11 and 16, the voltage regulator of FIG. 17 is optimized for high impedance or unterminated output loads. The regulator supplies a regulated voltage $V_{REG}$ at a regulator node 1703 to an N/N transmitter 1704 that drives an unterminated transmission line 1706 via an output pad 1708 that is loaded by a load capacitance $C_L$. Unlike the previously described embodiments, the flying capacitor logic 1702 enables the circuit to deliver charge into the voltage regulation node 1703 on both the rising and falling data transitions and of a data signal. In ideal circumstances, this provides a doubling of the power efficiency associated with the regulator circuit 1700.

Further referring to FIG. 17, the flying capacitor logic 1702 includes switches configured to selectively couple the terminals of a floating adjustable capacitor $C_r$ to a variety of power supply levels, including $V_{DD}$, $V_S$ and ground. Flying capacitors benefit from any standard IC fabrication process that has the capability to free both capacitor plates from being fixed to a particular voltage. Implementation details regarding integrated circuit flying capacitors are omitted for brevity purposes, being well-known to those having skill in the art. Taking advantage of this flexibility in IC fabrication provides enhanced power efficiency as compared to the previously described embodiments.

With continued reference to FIG. 17, the flying capacitor logic 1702 includes a first switch SC1 having a control input (not shown) responsive to the data component DataN and is disposed between the power supply high rail voltage $V_{DD}$ and a first terminal of the floating capacitor $C_r$. Here, the floating capacitor represents the regulator capacitance referred to above in previous embodiments. A second switch SC2 having a control input (not shown) responsive to the data component DataP, lies between the first terminal and the regulation node. A third switch SC3, responsive to DataP, couples a second terminal of the floating capacitor Cr to the regulation node 1703. A fourth switch SC4, responds to DataN, and is coupled between the second terminal of the flying capacitor $C_r$ and a ground terminal 1706. While a single flying capacitor circuit is shown and described herein, it should be understood that any number N of flying capacitors may be implemented to suitably scale the floating capacitance $C_r$.

In operation, the network of switches SC1-SC4 selectively cooperate in response to control logic (not shown) to, during a rising edge transition of the data component DataP, create a charging path from $V_{DD}$ through the floating capacitor Cr to the regulator capacitance $C_S$. During the rising edge data transition of the data component DataN, a path is created from the ground terminal 1706 through the floating capacitor Cr to the regulator capacitance $C_S$. Because charge is delivered during both edge transitions of the differential output data signal, the efficiency of the circuit is twice that of the previously described embodiments. Various parameters, including charge, power and power efficiency, can be expressed as follows:

$$\Delta Q_{L \to H} = (V_{DD} - 2V_{REG}) * Cr$$

$$\Delta Q_{H \to L} = (V_{DD} - 2V_{REG}) * Cr$$

$$P_{VsReg} = f_{L \to H} * C_{Load} * V_{DD} * V_{REG}/2$$

$$\eta_{signaling} = 2V_{REG}/V_{DD}$$

where $\Delta Q_{H \to L}$ is the charge that is delivered from $V_{DD}$ to $V_{REG}$ for every high-to-low data transition.

As noted above, the floating capacitor $C_r$ is adjustable, including a capacitor network of active gates responsive to a programmable input to vary it's overall capacitance. The value of the floating capacitor Cr with respect to the output capacitive load $C_L$ is generally based on the ratio between the regulator voltage $V_{REG}$ and the high power supply rail $V_{DD}$. A calibration mechanism may be employed to provide a way to trim the value of the floating capacitance Cr such that an appropriate ratio of $C_r$ to $C_L$ can be maintained during operation.

Those skilled in the art will appreciate the many benefits and advantages afforded by the voltage regulator embodiments disclosed herein. For terminated load applications, where an output load is on the order of the transmission line characteristic impedance, calibrated load current is conveniently injected into a regulator node based on predicted input data transmissions. Supplying load current during an entire bit interval enables the regulation node to maintain a relatively constant regulation voltage free from the effects of data-induced droop. For unterminated or high-impedance line applications, compensation current or charge may be delivered to the regulation node only as-needed, such as during rising edge transitions of the data signal. Selective compensation in this manner provides significant power dissipation and efficiency advantages.

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

The invention claimed is:

1. An integrated circuit comprising:
a voltage regulator to supply a regulated voltage;
a circuit to process data, the circuit drawing a variable amount of power from the voltage regulator according to the data;
wherein the voltage regulator comprises
a first current source to provide a calibrated current that is dependent on the data, and
a second current source to provide a supplemental current in dependence on a difference between the current required by the circuit and the calibrated, data-dependent current.

2. The integrated circuit according to claim 1 wherein the first current source provides the calibrated, data-dependent current in dependence upon a calibration setting.

3. The integrated circuit according to claim 2 further comprising a register, and wherein the calibration setting is programmed into the register.

4. The integrated circuit according to claim 1 wherein the first current source is an open-loop current source and the second current source is a closed-loop current source.

5. The integrated circuit according to claim 4 wherein the open-loop current source is selectively enabled to provide the calibrated current based on data to be transmitted to another integrated circuit.

6. The integrated circuit according to claim 5 and further including a register, coupled to the open-loop current source to store the calibration setting.

7. The integrated circuit according to claim 4 wherein the closed-loop current source includes a comparator having a reference input, and a regulation voltage input for comparison to the reference input.

8. The integrated circuit according to claim 1 wherein the calibrated, data-dependent current is enabled in response to the transmitted data, the transmitted data represented by at least a predetermined threshold level.

9. The integrated circuit according to claim 1 wherein the calibrated, data-dependent current is enabled in response to the transmitted data, the transmitted data represented by transitions in successive data bits.

10. A transmitter integrated circuit comprising:
a voltage regulator to supply a regulated voltage;
a driver circuit to transmit data at a signal swing corresponding to the regulated voltage and a load current;
wherein the voltage regulator comprises a source to supply a current that is dependent on the data; and to the driver circuit based on at least one calibration setting and wherein the voltage regulator further comprises a source of supplemental current to supply supplemental current to the driver circuit based on the difference between the actual load current and current needed by the driver circuit.

11. The transmitter integrated circuit according to claim 10 wherein the source to supply a data-dependent current comprises an open-loop current source.

12. The transmitter integrated circuit according to claim 10 wherein the source of supplemental current comprises a closed-loop current source circuit.

13. The transmitter integrated circuit according to claim 12 wherein the closed-loop current source circuit comprises:
a comparator having
a reference voltage input,
a second input to receive the regulator voltage, and
a comparator output; and
a second current source to generate the supplemental current, the second current source responsive to comparisons between the reference voltage and the regulator voltage to adjust the supplemental current.

14. The transmitter integrated circuit according to claim 10 wherein the data-dependent current is based on an internal calibration of the load current.

15. The transmitter integrated circuit according to claim 14 wherein the data-dependent current is based on an external impedance having a known value.

* * * * *